(12) United States Patent
Giovannoni

(10) Patent No.: US 12,140,615 B2
(45) Date of Patent: Nov. 12, 2024

(54) MEDIUM VOLTAGE SENSOR USING A MULTI-COMPONENT RESISTIVE VOLTAGE DIVIDER

(71) Applicant: ACLARA TECHNOLOGIES, LLC, St. Louis, MO (US)

(72) Inventor: Michael Giovannoni, Great Falls, VA (US)

(73) Assignee: Aclara Technologies LLC, St. Louis, MO (US)

( * ) Notice: Subject to any disclaimer, the term of this patent is extended or adjusted under 35 U.S.C. 154(b) by 316 days.

(21) Appl. No.: 17/689,505

(22) Filed: Mar. 8, 2022

(65) Prior Publication Data
US 2022/0187346 A1    Jun. 16, 2022

Related U.S. Application Data

(63) Continuation of application No. 16/530,801, filed on Aug. 2, 2019, now Pat. No. 11,268,991.

(60) Provisional application No. 62/713,966, filed on Aug. 2, 2018.

(51) Int. Cl.
| | |
|---|---|
| *G01R 19/25* | (2006.01) |
| *G01R 1/20* | (2006.01) |
| *G01R 15/06* | (2006.01) |
| *G01R 15/16* | (2006.01) |
| *G01R 19/00* | (2006.01) |
| *G01R 21/06* | (2006.01) |
| *G01R 35/00* | (2006.01) |

(52) U.S. Cl.
CPC ......... *G01R 19/2513* (2013.01); *G01R 1/203* (2013.01); *G01R 15/06* (2013.01); *G01R 15/16* (2013.01); *G01R 19/0084* (2013.01); *G01R 19/0092* (2013.01); *G01R 21/06* (2013.01); *G01R 35/005* (2013.01); *H01L 2924/00* (2013.01); *H01L 2924/0002* (2013.01)

(58) Field of Classification Search
CPC ................ G01R 19/0092; G01R 1/203; G01R 19/0084; G01R 15/16; G01R 21/06; G01R 35/005; G01R 19/2513; G01R 15/06; G01R 19/28; H01L 2924/00; H01L 2924/0002
USPC ............ 324/72, 76.11–76.83, 115, 126, 149
See application file for complete search history.

(56) References Cited

U.S. PATENT DOCUMENTS

| | | | |
|---|---|---|---|
| 2008/0122642 A1* | 5/2008 | Radtke | G06Q 50/06 340/12.32 |
| 2009/0273350 A1 | 11/2009 | Archer et al. | |
| 2013/0134998 A1 | 5/2013 | Kiko | |
| 2014/0125354 A1* | 5/2014 | Mason | G01R 15/16 324/686 |
| 2015/0006095 A1 | 1/2015 | Voisine | |
| 2016/0061862 A1 | 2/2016 | Nulty | |
| 2017/0023619 A1* | 1/2017 | Roberson | G01R 15/181 |

(Continued)

*Primary Examiner* — Raul J Rios Russo
(74) *Attorney, Agent, or Firm* — Michael Best & Friedrich LLP

(57) ABSTRACT

Improved power line management is provided by the systems and methods disclosed herein that accurately measures voltage in a power distribution system. In various embodiments, the system may include one or more sensor units, each coupled to the power lines using a capacitive or resistive voltage divider to yield a voltage at a sensor unit that is within a measurable range. In one aspect, this voltage may also be used to power the sensor unit and/or other devices coupled to it.

20 Claims, 18 Drawing Sheets

(56) References Cited

U.S. PATENT DOCUMENTS

2018/0088066 A1 3/2018 Schmidt et al.
2020/0328586 A1 10/2020 Eriksen

* cited by examiner

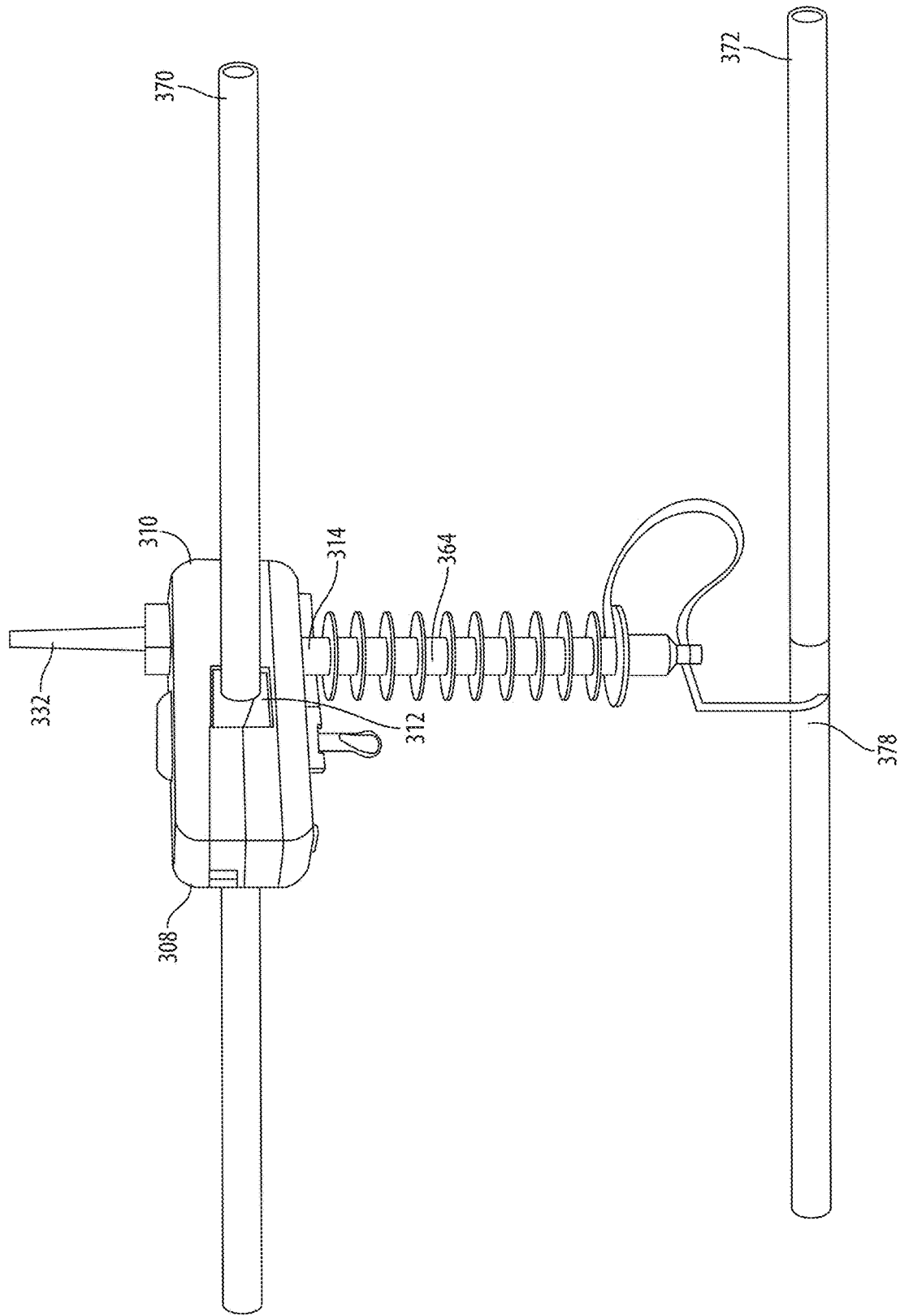

MEDIUM VOLTAGE SENSOR USING A MULTI-COMPONENT RESISTIVE VOLTAGE DIVIDER

CROSS REFERENCE TO RELATED APPLICATIONS

This application is a continuation of co-pending U.S. Non-Provisional application Ser. No. 16/530,801, filed Aug. 2, 2019, which is incorporated herein by reference in its entirety and which claims the benefit of U.S. Provisional Application No. 62/713,966, filed Aug. 2, 2018.

BACKGROUND

Power lines are widely used in many settings to carry 50 Hz or 60 Hz alternating current to power the worldwide economy. They form an important part of the power distribution system, carrying power from generation facilities all the way to the locations where it is used. The power distribution system may include many types of power lines with high voltage lines used closer to the power generation facilities and lower voltage lines closer to the locations where the power is used, such as homes and businesses, for example. Medium voltage lines, carrying voltages on the order of 30,000 Volts, are used in between.

A power company may desire to obtain accurate measurements of power-related parameters of the power lines in order to manage and maintain the power lines. Such measurements include one or more voltage measurements. For example, voltage measurements may be combined with current measurements to determine, and then manage, the amount of reactive power throughout the power distribution system (e.g., by using the measured voltage and current to determine how to operate switched capacitor banks and/or other components of a power distribution system). As another example, voltage measurements may be used to detect power theft. Voltage measurements may also be used for other purposes. For example, voltage measurements may be used to detect faults in the power distribution system, or to monitor and minimize the voltage at the end customers for Conservative Voltage Reduction (CVR) purposes of saving energy.

Conventional approaches to measuring the voltage of a high voltage power line involve using metal (e.g., copper) wire(s) or potential transformers (PT) to electrically couple a voltage sensor to a voltage carrying (i.e., "hot") wire of the power line and a neutral wire of the power line in order to measure the voltage between the voltage-carrying wire and the neutral wire.

SUMMARY

Improved power line management is facilitated through a system that accurately measures voltage in a power distribution system. The system comprises one or more sensor units, each coupled to the power lines using a capacitive or resistive voltage divider to yield, at a sensor unit, a voltage in a measurable range. That voltage may also be used to power the sensor unit and/or other devices that may be coupled to it.

To obtain a voltage measurement of a high-voltage power line, in some embodiments, a sensor unit may be attached to a voltage-carrying wire (i.e., a phase) of a power line and may further be coupled to another wire (e.g., phase, neutral wire or ground wire) of the power line via a capacitor. The sensor unit may be configured to measure one or multiple electrical properties of the voltage-carrying wire including, but not limited to, voltage, current, frequency, harmonics, disturbances, faults, relative phase angle, power, direction of power, power quality, and power factor. For example, the sensor unit may obtain a voltage measurement of the power line by measuring the voltage between the voltage-carrying wire and the neutral wire or ground, measuring a current flow through the resistive element, and adjusting the measured voltage for the voltage drop across the resistive element based on the measured current flow and the resistance of the resistive element.

Accordingly, some aspects are directed to a system for measuring electrical properties of a power line comprising a first wire and a second wire. The system comprises a sensor unit configured for connection to the first wire and an elongated resistive element comprising a first end configured for connection to the sensor unit and a second end configured for connection to the second wire, the elongated resistive element having a distributed resistance.

Other embodiments are directed to a resistive element adapted for connecting a sensor unit between a first wire and a second wire of a power line. The resistive element comprises an elongated member having a length of at least 3 feet, the elongated member having a first end and a second end, wherein the elongated member has an average resistance of at least 1 MOhm/foot and a resistance distribution variation of less than +/−40% between any two 12 inch segments of the elongated member.

Still other aspects are directed to a method of operating a sensor unit coupled to a power line, the power line comprising at least a hot wire carrying in excess of 1,000 volts and another wire. The method comprises measuring a voltage between the hot wire and the other wire with a voltage sensor in the sensor unit, measuring a current flow through a resistive element connected in series with the sensor unit between the hot wire and the other wire, and adjusting the voltage measurement based on the measured current through the resistive element.

Accordingly, in some aspects, the invention may be embodied as a power line sensor unit configured for connection to a power line, such as an underground or an overhead power line. The sensor unit may comprise a first capacitor comprising a first electrode and a second electrode, a port configured to receive a connection to a second capacitor, where the first electrode of the first capacitor is connected to the port and the second electrode of the first capacitor is configured for connection to the power line. The sensor unit may further comprise a voltage sensor configured to measure a voltage at the port, whereby the measured voltage is indicative of the voltage of the power line.

In another aspect, the invention may be embodied as a method of measuring parameters of a medium-voltage power line with a sensor unit. The method may comprise the act of measuring a voltage at an electrode of a first capacitor or resistor (which may indicate the voltage across the first capacitor or resistor). The sensor unit may be configured such that the first capacitor or resistor is disposed within the sensor unit and is connected to a hot wire of the power line, where the first capacitor or resistor is coupled to a first electrode of a second capacitor or resistor. The second capacitor or resistor may be connected between the sensor unit and a neutral wire or ground of the power line, and the first capacitor or resistor may be smaller than the second capacitor or resistor.

In yet another aspect, the invention may be embodied as a power line monitoring system for making at least one power-related measurement on a poly-phase line comprising at least a first wire and a second wire. The system may comprise a sensor unit attached to the first wire, where the sensor unit may comprise a first capacitor or resistor comprising a first electrode and a second electrode, the second electrode of the first capacitor or resistor being coupled to the first wire. The sensor unit may further comprise a voltage sensor configured to measure a voltage at the first electrode of the first capacitor or resistor, a second capacitor or resistor having a first electrode and a second electrode, the first electrode of the second capacitor or resistor being coupled to the first electrode of the first capacitor or resistor, and the second electrode of the second capacitor or resistor being coupled to the second wire.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 11a is an illustration of a sensor unit in accordance with some embodiments of a system for sensing and measuring at least one voltage-related property of a power line.

DETAILED DESCRIPTION OF THE INVENTION

Figure 1:
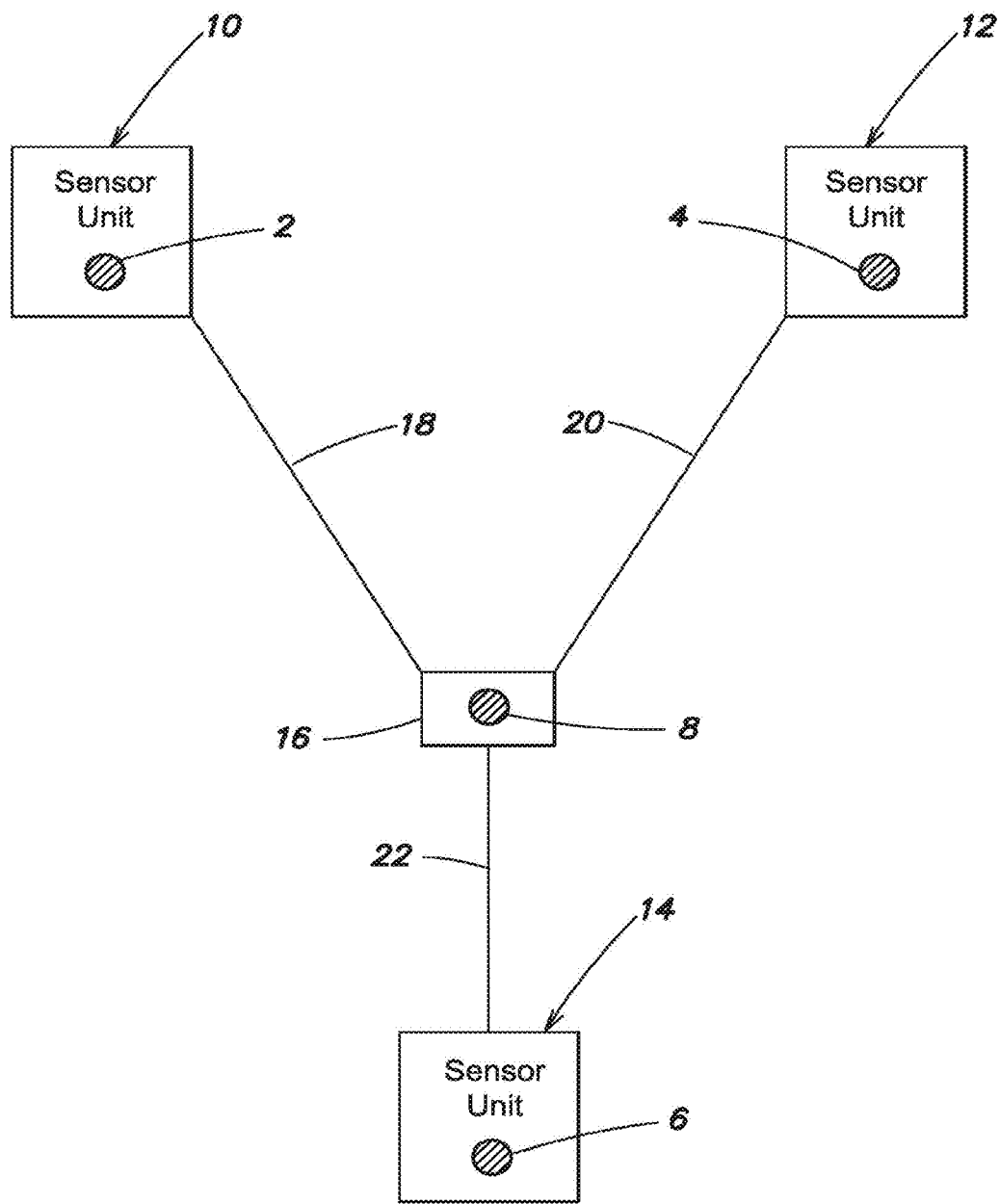
FIG. 1 is an illustration of a three-phase power line "WYE" circuit in which embodiments of the disclosure provided herein may operate.

Improved power line management may be achieved with a sensor unit with simple construction, yet can accurately measure line voltage. Such a device may be efficiently constructed and safely installed using commercially available components, such as capacitors designed for power line voltages.

The capacitors may be configured as a capacitive voltage divider. Voltage measurement circuitry may be connected to a tap of the voltage divider, allowing a relatively low voltage to be measured inside the sensor unit, even when the sensor is connected to a power line. Line voltages, on the order of 30,000 Volts, may be accurately determined by measuring the voltage at the tap, which may be on the order of 0 to 600 Volts.

To facilitate creation of a capacitive voltage divider, the sensor unit may include a first capacitor. The sensor unit may have a clamp that connects the sensor unit electrically, and in some embodiments physically, to a wire of the power line. For example, the sensor unit may be attached to the hot wire of a medium-voltage power line. Such a connection may also electrically connect an electrode of the first capacitor to the wire to which the sensor unit is attached. In other embodiments, the sensor may be electrically connected to the wire without making a physical connection (i.e., a contactless sensor). The sensor unit may also have a port to which another electrode of the first capacitor may be connected such that, when the sensor unit is attached to a wire of a power line, the first capacitor is connected between that wire and the port.

The port may be configured such that a second, larger capacitor external to the sensor unit may also be connected to the port. The second capacitor may be configured, such as with a clamp, for attachment to another wire of the power line. The second, larger capacitor may be connected to the neutral wire of the power line.

In some embodiments, the sensor unit may be sized and shaped for attachment to an overhead medium voltage power line. However, other embodiments may be sized for power lines in other voltage ranges, such as by changing the capacitance of one or both of the capacitors in the voltage divider. Moreover, in some embodiments, the sensor unit may be shaped for connection to an underground power line. In such an embodiment, the sensor unit may have an attachment mechanism that connects the sensor unit to the power line through a test access port.

Other measurement circuitry may alternatively or additionally be included within the sensor unit. Current measurement circuitry may be included. Such circuitry may operate with a Hall-effect sensor, Rogowski coil, current transformer, or any other suitable component to measure current. Alternatively or additionally, environmental sensors may be included in the sensor unit. For example, temperature or moisture sensors may be included.

In some embodiments, the use of a capacitive voltage divider to connect the sensor unit to the power line may also provide a source of power for the sensor unit and/or other nearby devices. Because the capacitive voltage divider may supply power even when no current is flowing on the power line, harvesting power from the capacitive voltage divider enables the sensor unit to draw power under a wide range of conditions, including at the end of a line, or when there is a fault on the line preventing current flow. To avoid inaccuracies in voltage measurement, techniques may be used to reduce the impact on the measured voltage from drawing power from the same point at which voltage is being measured.

Such techniques may include computational techniques under which the impact may be assessed, such as through a calibration process in which an offset is determined. The offset, correcting for changes in measured voltage caused by drawing power from the measurement point, may be applied to voltage measurements. As an example of another technique, the sensor unit may include a charge storage device, such as a battery or super capacitor. The charge storage device may be charged using the voltage from the capacitive voltage divider while no measurement is being made. To make a measurement, the charge storage device may be disconnected from the measurement point, but still connected to power the measurement circuitry.

In a conventional approach using a metal wire to electrically couple a voltage sensor between two wires of a power line, if the connector were to become damaged by breaking (e.g., into two or more segments), the segment of the broken metal connector would be "hot." This dangling metal segment could pose a risk to the surrounding environment including to utility crews, pedestrians, and other equipment. In contrast, when a distributed resistive element is used, the longer the resistive conductor segment is (thereby posing a risk of arcing and/or contact with other elements), the more resistive it will be. Accordingly, the possible current flow, and thus associated risk, is reduced.

Using a resistive element having a distributed resistance, to electrically couple a sensor unit between two wires of a power line may simplify installation of the sensor unit. In some embodiments, the sensor may be connected to the power line while power is flowing. Making such a connection might be undesirable using a metal wire.

Accordingly, in some embodiments a system for measuring electrical properties of a power line (e.g., a high or medium voltage power line) in a power distribution system is disclosed. The power line may have a plurality of voltage-carrying wires (e.g., three voltage-carrying wires in a three-phase line) and, in some embodiments, may also have a neutral wire. The system may comprise a sensor unit electrically coupled to a wire of the power line and an elongated resistive element having a distributed resistance and electrically coupling the sensor unit to another wire of the power line (e.g., another voltage-carrying wire or the neutral wire).

In this configuration, the sensor unit may obtain voltage, current, and/or any other electrical measurements of the wire to which it is attached. A medium voltage power line may be a power line carrying less than approximately 50 KVolts. A high voltage power line may be a power line carrying greater than approximately 50 KVolts.

In some embodiments, the resistive element having a distributed resistance may comprise a plastic/carbon fiber extrusion formed by doping or coating plastic (e.g., fiber made of plastic) with carbon or other elements or compounds to produce a uniform, high resistance material. Though, in other embodiments, conductive ink may be used. The plastic/carbon fiber extrusion may form a resistive core of the distributed resistive element and may be insulated by a protective (e.g., insulative) jacket.

In some embodiments, the resistive element having a distributed resistance may comprise a substrate comprising conductive traces and having a plurality of discrete resistors connected in series and attached to the conductive traces. The resistive element may be flexible, rigid, or be at least partially flexible and at least partially rigid. For example, in some embodiments, the resistive element may comprise a plurality of segments including at least one flexible segment and at least one rigid segment.

In some embodiments, a high voltage power line may carry at least 1,000 volts. In some embodiments, a high voltage power line may carry between 5,000 and 15,000 volts. In some embodiments, a high voltage power line may carry at least 5,000 volts, at least 10,000 volts, at least 25,000 volts, at least 50,000 volts, at least 100,000 volts, at least 250,000 volts, or at least 500,000 volts. As a specific example, a resistive element may be configured to span wires that differ in voltage by approximately 70,000 volts. It should be appreciated that a high voltage power line may carry any other suitable voltage or a range of voltage, as aspects of the disclosure provided herein are not limited in this respect.

It should be appreciated that the embodiments described herein may be implemented in any of numerous ways. Examples of specific implementations are provided below for illustrative purposes only. It should be appreciated that these embodiments and the features/capabilities provided may be used individually, all together, or in any combination of two or more, as the application is not limited in this respect.

FIG. 1 illustrates one environment in which embodiments of the disclosure provided herein may operate. In particular, FIG. 1 shows an illustrative WYE three-phase power line circuit comprising wires 2, 4, and 6 for conducting three-phase power and a neutral or ground wire 8. Attached to each wire 2, 4, and 6 is a corresponding sensor unit 10, 12, and 14, respectively. A sensor unit may be attached to a wire mechanically, for example by using clamps, conductive adhesives or any other suitable mechanisms, as aspects of the disclosure provided herein are not limited in this respect. In the illustrated embodiment a different sensor unit is attached to each of the three voltage-conducting wires, but in other embodiments sensor units may be attached to each of two or all three of the wires in a three-phase power line. In some embodiments, a sensor unit may be attached to only some wires in a power line such that there may be one or multiple voltage-carrying wires in the power line to which no sensor unit is attached. For example, in a three-phase power line a sensor unit may be attached only to one of three or only two of three voltage-carrying wires.

Sensor units 10, 12, and 14 are electrically coupled to neutral wire 8 via resistive elements 18, 20, and 22, respectively. In particular, resistive element 18 runs between sensor unit 10 and neutral wire 8, resistive element 20 runs between sensor unit 12 and neutral wire 8, and resistive element 22 runs between sensor unit 14 and neutral wire 8. Resistive elements 18, 20, and 22 are mechanically coupled to neutral wire 8 using clamp 16, though other mechanical means may be used to couple one or more resistive elements to a neutral wire, as aspects of the disclosure provided herein are not limited in this respect. In addition, though a single clamp is shown in the embodiments of FIG. 1, it should be appreciated that FIG. 1 schematically illustrates the connections. In some embodiments, multiple clamps (and/or other mechanical means) may be used to attach resistive elements to a neutral wire. For example, each resistive element may be attached with a separate clamp.

Each of resistive elements 18, 20, and 22 may have a distributed resistance. Each of resistive elements 18, 20, and 22 may be of any suitable type of resistive element having a distributed resistance, illustrative examples of which are described below with reference to FIGS. 2 and 3A-3C. In some embodiments, each of resistive elements 18, 20, and 22 is the same type of resistive element. In other embodiments, two or all three of the resistive elements 18, 20, and 22 are different types of resistive elements.

A resistive element having a distributed resistance (e.g., resistive elements 18, 20, and 22) may have any suitable length to connect a sensor unit to another wire (e.g., neutral wire 8, FIG. 1). For example, a resistive element may be at least two feet long, at least three feet long, at least four feet long, at least five feet long, at least six feet long, at least ten feet long, at least twenty feet long, or may be any other suitable length needed to connect the sensor unit to another wire.

A resistive element having a distributed resistance (e.g., elements 18, 20, and 22) may be constructed to provide any suitable amount of resistance per a unit (e.g., a foot, a meter, multiple feet, multiple meters) of its length. The amount of resistance per unit length may depend on the distance and voltage between wires to be spanned by the resistive element. Further, the resistive element may reflect a tradeoff between power consumption and accuracy of voltage measurements. A resistive element having a higher resistance may be one for which a sensor unit obtains lower accuracy voltage measurements. On the other hand, a resistive element having a lower resistance and allowing for higher accuracy voltage measurements dissipates more power. In some embodiments, the resistance per unit length can be determined, and for a resistive element with a given length and a given voltage between wires to be spanned by the resistive element, to provide a measurable signal of less than a target value of volts (e.g., less than 10 volts, less than 5 volts, less than 2.5 volts, or less than 1.25 volts in some embodiments), and with a power dissipation of less than a target value, which for example may be 100 watts or less, 50 watts or less, 35 watts or less, 25 watts or less, 10 watts or less, among others. For example, in some embodiments, a resistive element may have a distributed resistance of at least 0.5 MOhm/foot, at least 1 MOhm/foot, at least 3 MOhm/foot, at least 5 MOhm/foot, at least 10 MOhm/foot, at least 15 MOhm/foot, etc. In its entirety, a resistive element may provide for a resistance of at least 10 MOhms, at least 20 MOhms, at least 30 MOhms, at least 50 MOhms, at least 75 MOhms, or any other suitable resistance, as aspects of the disclosure provided herein are not limited in this respect.

In some embodiments, the distributed resistance of a resistive element may be uniform along its length such that any segment of a given length will have the same resistance as any other segment of the same length. Though, it is not a requirement that the distributed resistance be uniform. In some embodiments, variations in manufacturability may result in variations in resistance along the length of the resistive element. Alternatively or additionally, the resistive element may contain segments for flexibility or to provide desirable mechanical properties that are not resistive or that have different resistive properties than the bulk of the resistive element. Accordingly, in some embodiments, the distributed resistance of a resistive element may vary along the length of the element. For example, the distributed resistance of any one 12 inch segment of the resistive element may vary by no more (i.e., less) than a certain percentage of the distributed resistance of any other 12 inch segment of the resistive element. For instance, the distributed resistance of any segment may vary by less than 10%, by less than 25%, by less than 40%, by less than 50% from the distributed resistance of any other segment of the resistive element of 12 inches or other comparable length.

A resistive element having a distributed resistance (e.g., elements 18, 20, and 22) may be constructed so as to dissipate a small amount of power along its length. For example, in some embodiments, the resistive element connecting two wires (e.g., conducting wire 2 and neutral wire 8 as shown in FIG. 1) of a power line carrying a voltage of at least 35K Volts may dissipate less than 25 Watts.

A resistive element having a distributed resistance may be constructed to have any of the above-described properties (e.g., resistivity properties, power dissipation properties, length, etc.) in any of numerous ways, illustrative examples of which are described below.

Figure 2:
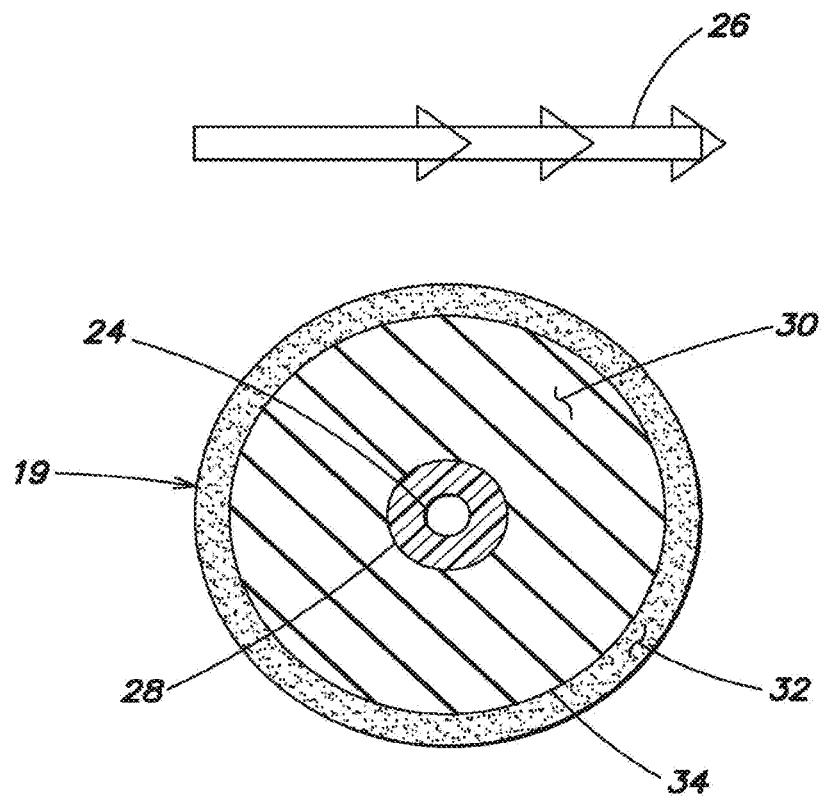
FIG. 2 illustrates one type of resistive element having a distributed resistance, in accordance with some embodiments of the disclosure provided herein.

One type of resistive element having a distributed resistance is illustrated in FIG. 2, which shows a cross-section of resistive element 19 having a distributed resistance. The cross-section of resistive element 19 includes a central hole 24 configured to receive a pin 26 that is utilized for centering resistive element 19. A high resistance extrusion 28 surrounds central hole 24. Extrusion 28 may be formed in any suitable way and, in some embodiments, may be a plastic/carbon fiber extrusion formed by doping the core of a fiber or plastic with carbon or other elements or compounds. One end of extrusion 28 may be electrically coupled to a sensor unit (e.g., sensor unit 10, 12, or 14) and the other end of extrusion 28 may be electrically coupled to another wire (e.g., neutral wire 8 or another voltage-carrying wire having a different phase than the wire to which the sensor unit is coupled). As shown in FIG. 2, resistive element 19 has central hole 24, but in other embodiments a resistive element may not have a central hole, as aspects of the disclosure provided herein are not limited in this respect.

Resistive element 19 further comprises high voltage dielectric 30 surrounding extrusion 28 and an insulative sheath 32 surrounding dielectric 30. Insulative sheath 32 may be configured to avoid moisture and sunlight from passing through, potentially compromising the internal construction of resistive element 19. In some embodiments, resistive element 19 may comprise fiberglass 34 in place of or in addition to dielectric 30 to avoid stretching of resistive element 19 in use.

The extrusion 28 may have any suitable distributed resistance. For example, in some embodiments, extrusion may have a distributed resistance of at least 0.5 MOhm/foot, at least 1 MOhm/foot, at least 3 MOhm/foot, at least 5 MOhm/foot, at least 10 MOhm/foot, at least 15 MOhm/foot, 50 MOhms/5 feet, or any other suitable distributed resistance.

Figure 3A:
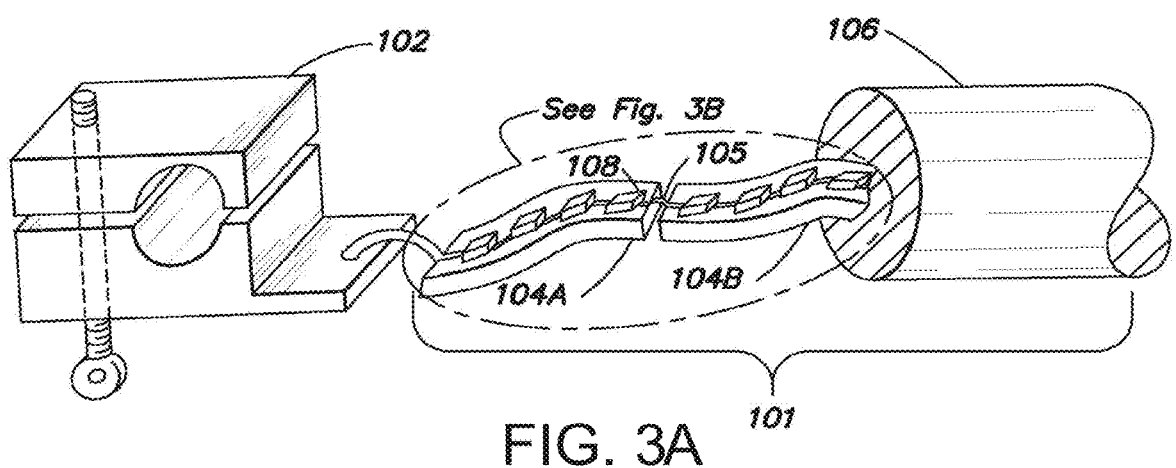
FIGS. 3A-3B illustrate another type of resistive element having a distributed resistance, in accordance with some embodiments of the disclosure provided herein.
Figure 3B:
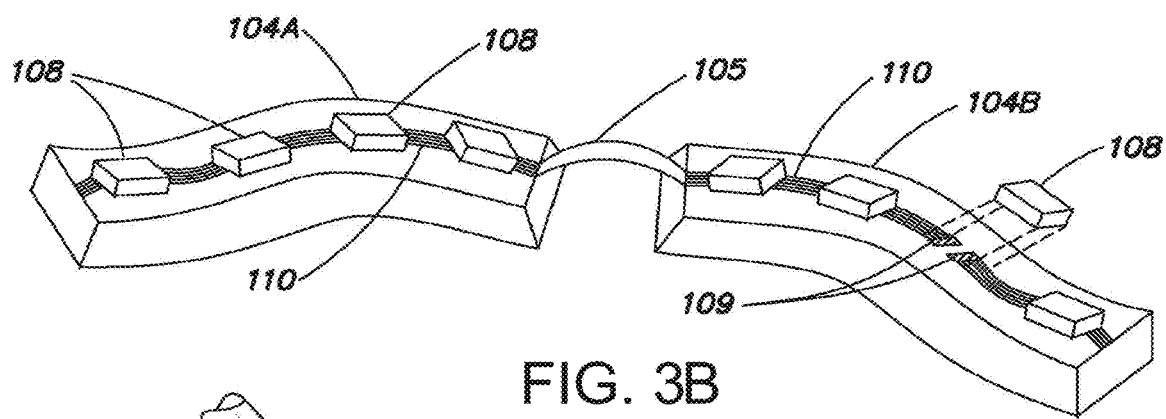

Another type of resistive element having a distributed resistance is illustrated in FIGS. 3A-3B, which show the structure of resistive element 101 having a distributed resistance, with suitable resistive characteristics, which may be as described in connection with other embodiments. Resistive element 101 comprises flexible substrate 104 enclosed by an insulative sheath 106. Flexible substrate 104 may be formed of any suitable material having a high resistance such as thin printed circuit board segments, plastic or any suitable high-resistance polymer, including KAPTON or other material used in the manufacture of flexible circuit assemblies. Insulative sheath 106 may be configured to protect flexible substrate 104 and any elements disposed thereon (e.g., from moisture, sunlight, etc.) and may be constructed in any suitable way, as aspects of the disclosure provided herein are not limited in this respect.

Resistive element 101 comprises multiple discrete resistors 108 disposed on flexible substrate 104. Resistive element 101 further comprises conductive traces 110 disposed on flexible substrate 104 between resistors 108. Conductive traces 110 and resistors 108 may provide for a resistive path extending along the length of resistive element 101. Conductive traces 110 allow resistive element 101 to electrically couple to a sensor unit, which may be attached to a hot wire of a power line (e.g., sensor unit 10), to another wire of the power line such as a neutral wire (e.g., wire 8), or another wire of the power line carrying current at a different phase from the hot wire to which the sensor unit may be attached (e.g., wire 4 or 6). Conductive traces 110 may be coupled to a wire of a power line in any suitable way and, for example, may be coupled (e.g., soldered) or may be connected through a connector to a clamp attached to the wire. As shown in FIG. 3A, for example, conductive traces 110 are coupled to clamp 102.

Conductive traces 110 may be formed in any suitable way using any suitable conductive (e.g., at least partially carbon and/or at least partially metallic) or partially conductive material. In some embodiments, conductive traces 110 may comprise a layer of at least partially conductive ink disposed on flexible substrate 104. In some embodiments, a layer of partially conductive ink may provide sufficient resistance distributed along the length of resistive element 101.

As previously mentioned conductive traces 110 and resistors 108 may provide for a resistive path. This may be done in any suitable way. For example, a resistive path may be created by using the conductive traces to connect resistors in series. In the illustrated embodiment, conductive traces 110 comprise multiple non-contiguous segments used to connect resistors 108 is series. The resistors 108 are surface mount resistors attached (e.g., soldered) to the segments of conductive traces 110. For example, as shown in FIG. 3B, resistor 108 is in contact with ends 109 of adjacent segments of conductive traces 110, thereby coupling the two adjacent segments of conductive traces 110.

In some embodiments, flexible substrate 104 may comprise a plurality of segments, each segment having a resistive path provided thereon. Two segments 104a and 104b of flexible substrate 104 are illustrated in FIGS. 3A and 3B, though it should be appreciated that flexible substrate 104 may comprise any suitable number of segments. Each of segments 104a and 104b is illustrated as having a resistive path formed of four surface mount resistors 108 connected in series by segments of conductive traces 110. Though, each segment of flexible substrate 104 may have any other suitable number of resistors (e.g., two, three, five, six, seven, eight, nine, at least ten, at least twenty, etc.), as aspects of the disclosure provided herein are not limited in this respect. Segments of flexible substrate 104 (e.g., segments 104a, 104b, etc.) may be electrically coupled (e.g., via a conductive jumper or in any other suitable way) to form a resistive path along the length of flexible substrate 104. In the illustrated embodiment, segments 104a and 104b are coupled via conductive jumper 105. In some embodiments, a resistive path may comprise a number (e.g., seven) of resistors per unit length (e.g., an inch) and a jumper loop wire. This may provide for maximum copper wire gap between jumpers and may allow for higher power handling capability.

It should be appreciated that FIGS. 3A and 3B are not drawn to scale. However, to provide a sense of scale applicable in some embodiments, resistors 108 may be surface mount resistors. Substrate 104 may have a width comparable to the width of such resistors and a thickness less than the thickness of such resistors.

Resistors 108 may be connected in series, as previously described, thereby providing resistive element 101 with a distributed resistance. Resistors 108 may be spaced regularly or irregularly. In some embodiments, resistors 108 may be spaced such that the average pitch (i.e., center-to-center spacing between neighboring resistors) is less than a particular distance (e.g., less than 1 inch, less than 0.75 inch, less than 0.5 inch, less than 0.25 inch, less than 0.1 inch, less than 0.05 inch, etc.).

In some embodiments, for example, the resistors may be spaced to provide 4 or 5 resistors per inch. Each resistor 108 may have any suitable resistance. For example, a resistor 108 may have a resistance of at least 50 KOhms, 100 KOhms, of at least 200 KOhms, of at least 250 KOhms, of at least 300 KOhms, of at least 500 KOhms, of at least 750 KOhms, of at least 1 MOhm, etc. Resistors 108 may comprise resistors of different types and having different resistivity, as aspects of the disclosure provided herein are not limited to using resistors of the same type and resistivity. It should be appreciated that only four resistors are shown in FIG. 3A for clarity and that any suitable number of resistors (e.g., at least 5, at least 10, at least 20, at least 25, at least 50, at least 100, etc.) may be attached to the flexible substrate 104.

Figure 3C:
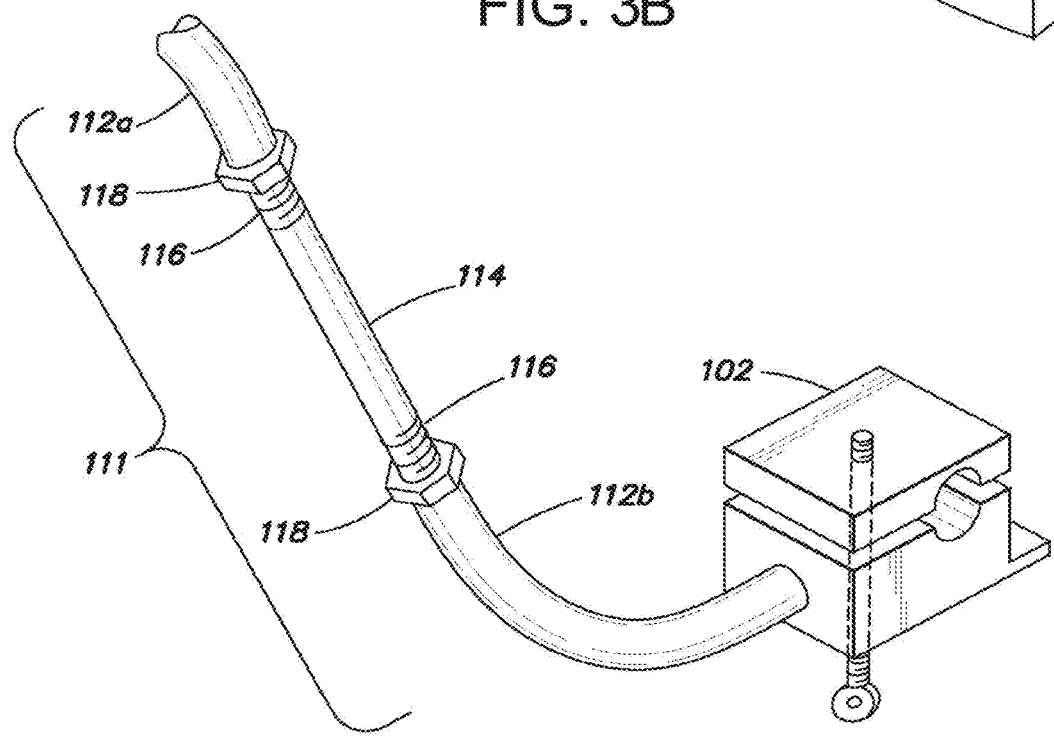
FIG. 3C illustrates yet another type of resistive element having a distributed resistance, in accordance with some embodiments of the disclosure provided herein.

In the embodiment illustrated in FIGS. 3A and 3B, the resistive element may comprise a flexible portion, with clamps at each end for connection to wires. Though, other construction techniques are possible. For example, the resistive element may be terminated by using screw on sealed connectors. Another construction technique for a resistive element having a distributed resistance is illustrated in FIG. 3C, which shows resistive element 111 having a distributed resistance. As shown, resistive element 111 comprises multiple segments, some or all of which may be rigid. Though, having at least some of the segments be flexible may simplify installation and/or increase the ability to withstand damage from environmental forces such as wind. FIG. 3C illustrates segments including bent segment 112a coupled in series with straight segment 114 that is coupled in series with bent segment 112b. As shown, bent segments 112a and 112b are coupled to straight segment 114 via threaded coupling 116, and are secured via nuts 118. Though, any other suitable means may be used to couple segments of a resistive element, as aspects of the disclosure provided herein are not limited in this respect. FIG. 3C shows a resistive element having three sections, but this is a non-limiting and illustrative example, as a resistive element may comprise any suitable number of sections (e.g., one, two, four, five, six, etc.).

Each section of resistive element 111 may be rigid or flexible. In the embodiments illustrated in FIG. 3C, for example, straight segment 114 may be rigid and bent segments 112a and 112b may be flexible to make it easier to couple resistive element 111 to wires of a power line. Alternatively or additionally, the segments of resistive element 111 may be provided as part of a kit adapted for connection between specific types of wires. In such a scenario, the dimensions and angles required to connect a sensor unit between wires of a power line may be known in advance and the components of the kit may be pre-configured with appropriate lengths and bend angles.

As shown, bent segment 112b couples resistive element 111 to clamp 102, which is configured to be attached to a wire of a power line. In some embodiments, all sections of resistive element 111 may be flexible, all sections of resistive element 111 may be rigid, or resistive element 111 may comprise any suitable number of rigid and flexible segments.

Resistive element 111 may be constructed to have a distributed resistance in any of numerous ways, including using any of the techniques described herein. In some embodiments, some or all of the segments of resistive element 111 may comprise a substrate having disposed thereon conductive traces with multiple resistors attached to the conductive traces in order to provide resistive element 111 with a distributed resistance. The substrate may be flexible and, in some embodiments, the segments of resistive element 111 may comprise a flexible substrate 104 described above with reference to FIGS. 3A and 3B. In other embodiments, segments of resistive element 111 may comprise a high-resistance core (e.g., plastic doped with carbon) or may be constructed in any other suitable way.

Though, other techniques may alternatively or additionally be used to form resistive elements, including incorporating conductive fillers or dopants other than carbon into a matrix material, such as a plastic. Whether such a material is doped or made resistive with a filler, the matrix material may be rigid or made flexible, such as through the inclusion of plasticizers or using other techniques. Accordingly, it should be appreciated that any resistive element (e.g., resistive elements 18 and 101 described with reference to FIG. 2 and FIGS. 3A-3B, respectively) may comprise one or multiple sections and each of said sections may be flexible or rigid.

Figure 4:
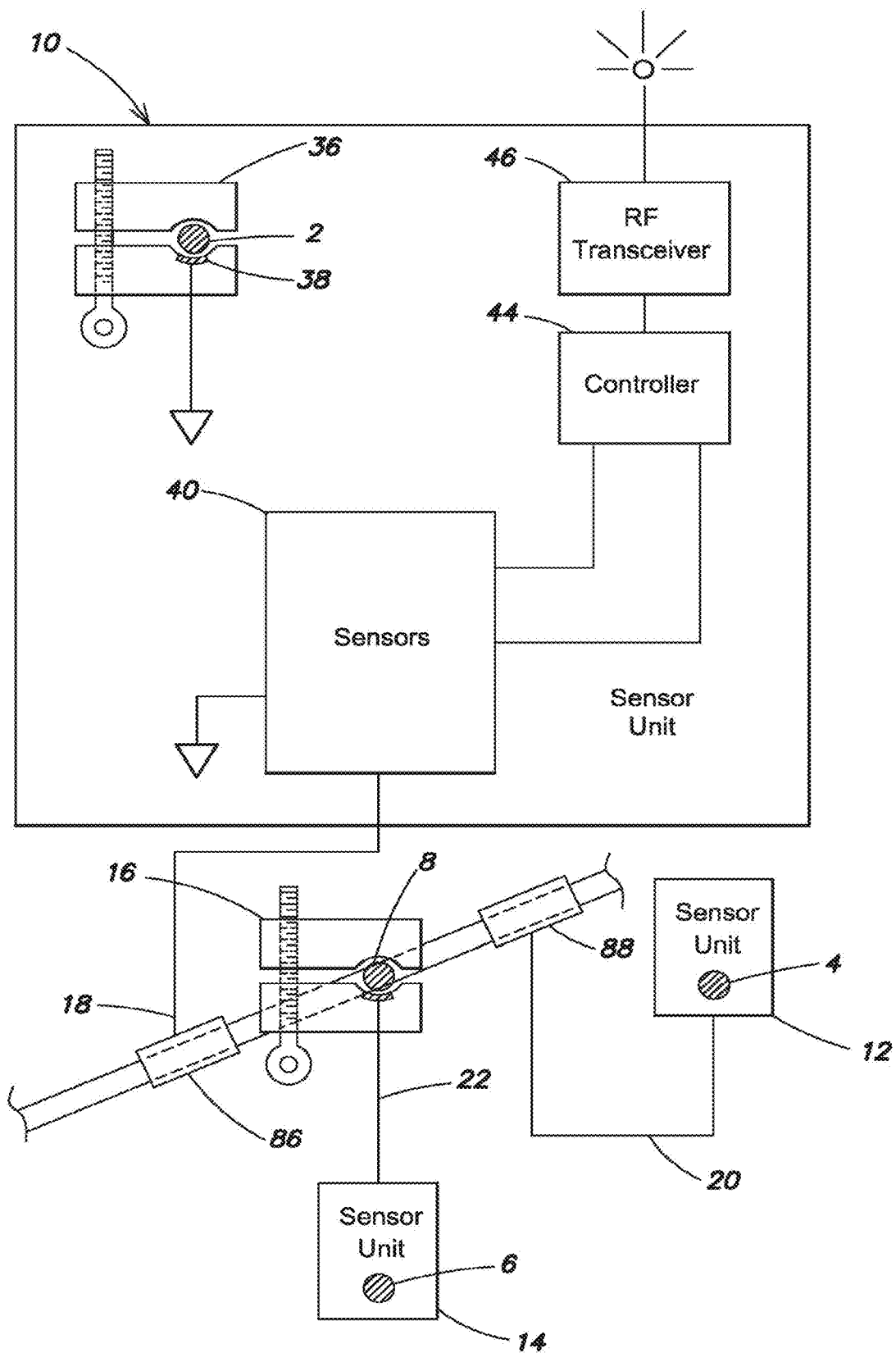
FIG. 4 illustrates a sensor unit configured to sense electrical properties of a three-phase power line in a "WYE" circuit, in accordance with some embodiments of the disclosure provided herein.

FIG. 4 illustrates sensor units configured to measure electrical properties of a three-phase power line in a "WYE" circuit. In particular, FIG. 4 illustrates components of sensor unit 10 described above with reference to FIG. 1. Sensor unit 10 comprises a clamp 36 for attaching the sensor unit to a power line wire (e.g., wire 2). Clamp 36 comprises contact 38 for making contact with the wire when clamp 36 is clamped about the wire. In high voltage power lines, each conducting wire may not be insulated. Accordingly, contact 38 may be in direct contact with the wire, when clamp 36 is attached to the wire.

Sensor unit 10 further comprises sensors 40, which are electrically coupled to contact 38 by virtue of contact 38 establishing a common reference potential within sensor unit 10. Sensors 40 may be directly connected to wire 2 through a contact (e.g., contact 38) or may be indirectly coupled to wire 2 using techniques known in the art. In some embodiments, voltage sensors may be directly connected and current sensors may be indirectly connected. Sensors 40 are also coupled to resistive element 18. In operation, sensors 40 are configured to measure at least the voltage between contact 38, which is in contact with wire 2 and acts as a common reference for measurements within sensor unit 10, and the voltage at a location on resistive element 18. As shown in FIG. 4, an end of resistive element 18 is connected to wire 8 via clamp 86. Accordingly, this voltage measurement may be related to the voltage between wire 2 and neutral wire 8. In some embodiments, sensors 40 may also include a current sensor, which may be coupled (directly or indirectly) to wire 2 and/or configured to measure current through resistive element 18. Any suitable measurement circuitry within sensors 40 may be used to relate a measured voltage within sensor unit 10 to the voltage between wires 2 and 8. Illustrative examples of suitable measurement circuitry are provided below in connection with FIGS. 7A and 7B.

In the embodiment illustrated, sensors 40 are connected to controller 44. Controller 44 is configured to calculate a voltage drop between wire 2 and neutral wire 8 or ground wire based at least in part on the measurements obtained by sensors 40.

Accordingly, it should be appreciated that a sensor unit (e.g., sensor unit 10) may be operated to measure electrical properties (e.g., voltage, waveforms, harmonics, disturbances, relative phase angle, power factor) of a hot wire of a high-voltage power line (e.g., a power line carrying in excess of 10 KVolts). The process of operating the sensor unit may include using the voltage sensor in the sensor unit to measure a voltage between the hot wire and the neutral wire or ground wire of the high voltage power line Sensor unit 10 further comprises RF transceiver 46 that may be used to transmit voltage measurements (e.g., voltage measurements calculated by controller 44) to one or more collection nodes (not shown) configured to receive voltage measurements from multiple sensor units deployed in a power distribution system. The collection node(s) may be configured to process the received voltage measurements and perform one or more functions (e.g., detect power theft, determine how to control voltage and/or reactive power in the power management system, provide notification of a recommended action to an operator, etc.). Sensor units 12 and 14 may be configured in a manner similar to sensor unit 10 or may be configured in any other suitable way.

These sensor units may make corresponding measurements of other wires of the power distribution system. In the embodiment illustrated in FIG. 4, sensor unit 12 is attached to wire 4 and coupled to neutral wire 8 via resistive element 20 having distributed resistance and clamp 88. Accordingly, sensor unit 12 may measure properties on wire 4, which may be a hot wire. Sensor unit 14 is attached to wire 6 and coupled to neutral wire 8 via resistive element 22 and clamp 16. Accordingly, sensor unit 14 may measure properties of wire 6, which may be a hot wire.

Figure 5:
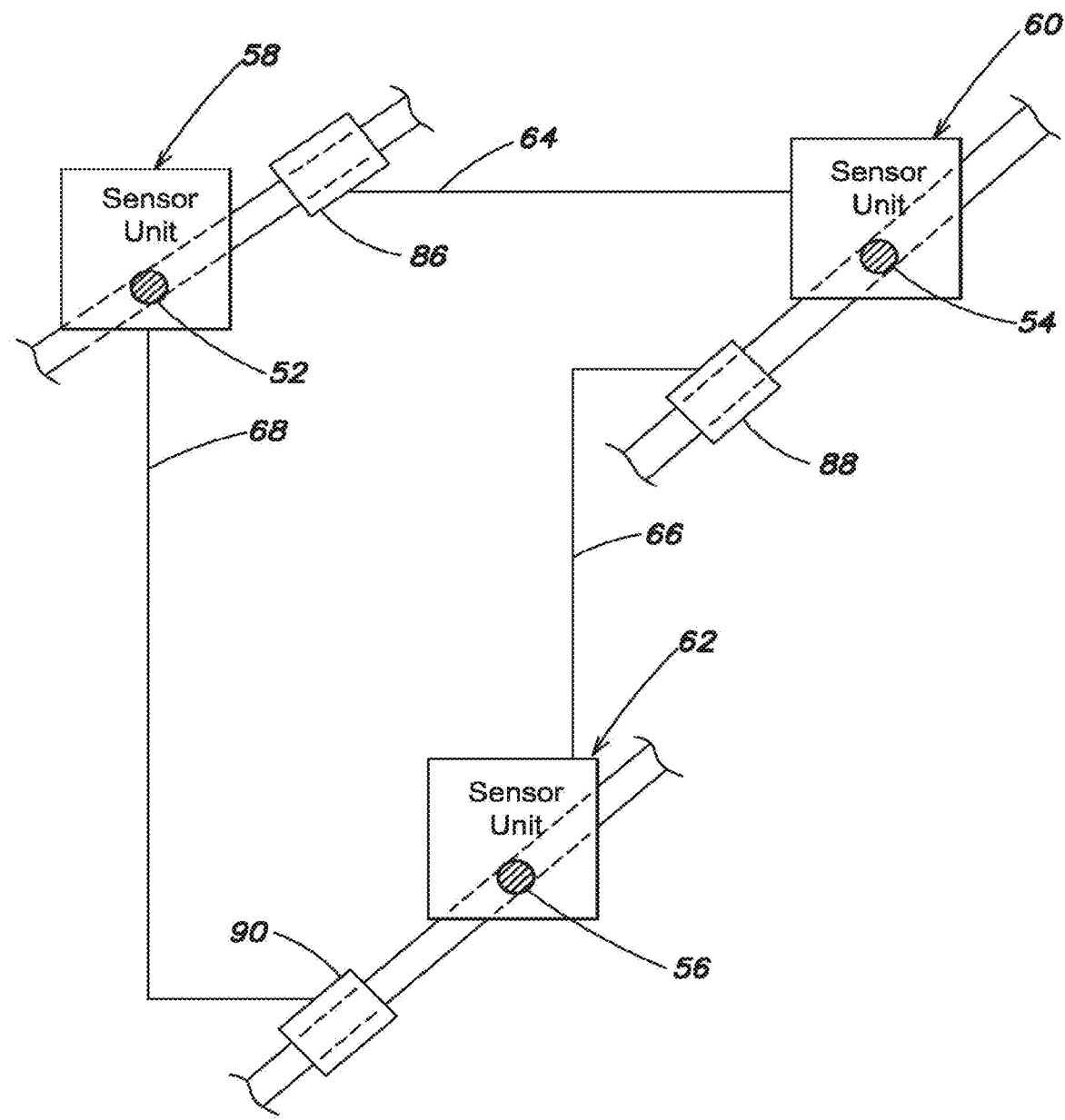
FIG. 5 is an illustration of a three-phase power line "DELTA" circuit in which embodiments of the disclosure provided herein may operate.

FIG. 5 illustrates another environment in which embodiments of the disclosure provided herein may operate. In particular, FIG. 5 shows an illustrative "DELTA" three-phase power line circuit comprising wires 52, 54, and 56 for conducting three-phase power. Attached (e.g., clamped) to each wire 52, 54, and 56 is a corresponding sensor unit 58, 60, and 62, respectively. Each of sensor units 58, 60, and 62 is electrically coupled to two voltage-carrying wires of the power line. As shown, sensor unit 58 is attached and electrically coupled to wire 52 and is also electrically coupled to wire 56 by resistive element 68. Accordingly, one end of resistive element 68 may be coupled to sensor unit 58, and the other and may be connected, such as through a clamp 90, to wire 56.

Sensor unit 60 is attached and electrically coupled to wire 54 and is also electrically coupled to wire 52 by resistive element 64. Sensor unit 62 is attached and electrically coupled to wire 56 and is also electrically coupled to wire 60 by resistive element 66. One end of each resistive element 64 and 66 may be connected, such as through a clamp 86 or 88, to a respective wire.

Each of resistive elements 64, 66, and 68 may have a distributed resistance. Each of resistive elements 64, 66, and 68 may be of any suitable type of resistive element having a distributed resistance, illustrative examples of which have been described with reference to FIGS. 2 and 3A-3C. In some embodiments, each of resistive elements 64, 66, and 68 is the same type of resistive element. In other embodiments, two or all three of the resistive elements 64, 66, and 68 are different types of resistive elements.

Figure 6:
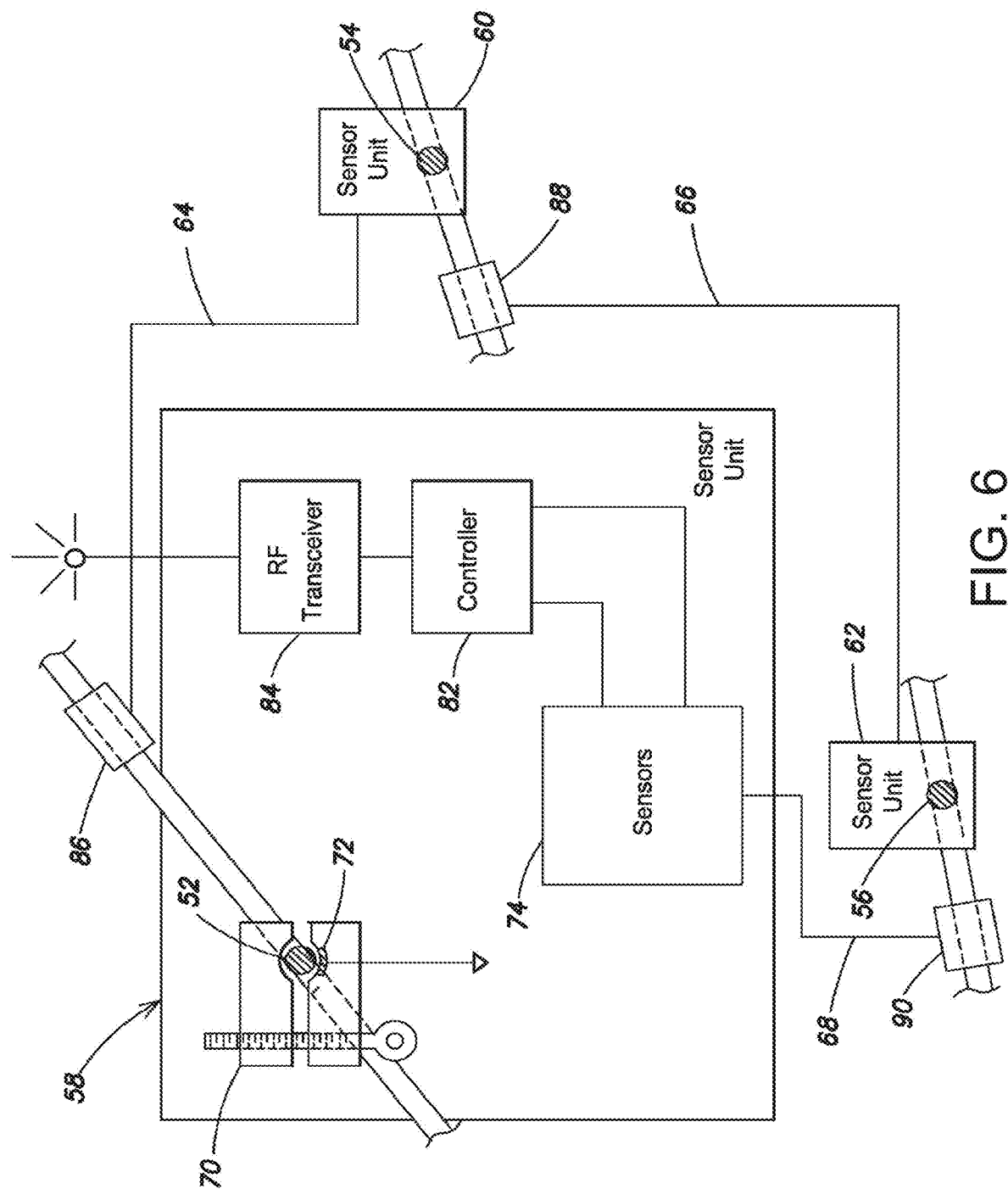
FIG. 6 illustrates a sensor unit configured to sense electrical properties of a three-phase power line in a "DELTA" circuit, in accordance with some embodiments of the disclosure provided herein.

FIG. 6 illustrates a sensor unit configured to sense electrical properties of a three-phase power line in a "DELTA" circuit. In particular, FIG. 6 illustrates components of sensor unit 58 described above with reference to FIG. 5. In some embodiments, sensor unit 58 may have the same structure as sensor unit 10 (FIG. 4).

In the embodiment illustrated, sensor unit 58 comprises a clamp 70 for attaching the sensor unit to a power line wire (e.g., wire 52). Clamp 70 comprises contact 72 for making contact with wire 52 when clamp 70 is clamped about the wire 52. Sensor unit 58 further comprises sensors 74 configured for use in measuring voltage between wire 52 and wire 56. In some embodiments, sensors 74 may include a current sensor, a voltage sensor, and/or other sensors.

In the embodiment illustrated, sensor unit 58 comprises controller 82 and sensors 74 are connected to controller 82. Controller 82 is configured to calculate a voltage drop between wire 52 and wire 56 based at least in part on the measurements obtained by sensors 74.

Accordingly, it should be appreciated that a sensor unit (e.g., sensor unit 58) may be operated to measure electrical properties (e.g., voltage) of a hot wire of a high-voltage power line (e.g., a power line carrying in excess of 10 KVolts). The process of operating the sensor unit may include using the voltage sensor in the sensor unit to measure a voltage between the hot wire and another hot wire (corresponding to a different phase) of the high voltage power line. In some embodiments, the process of operating the sensor unit further comprises installing the sensor unit by attaching the sensor unit to a hot wire of the high-voltage power line, while the hot wire is carrying current.

Sensor unit 58 further comprises RF transceiver 84 that may be used to transmit voltage values (e.g., voltage measurements calculated by controller 82) to one or more collection nodes (not shown) configured to receive voltage values from multiple sensor units deployed in a power distribution system. Sensor units 60 and 62 may be configured in a manner similar to sensor unit 58 or may be configured in any other suitable way.

Figure 7A:
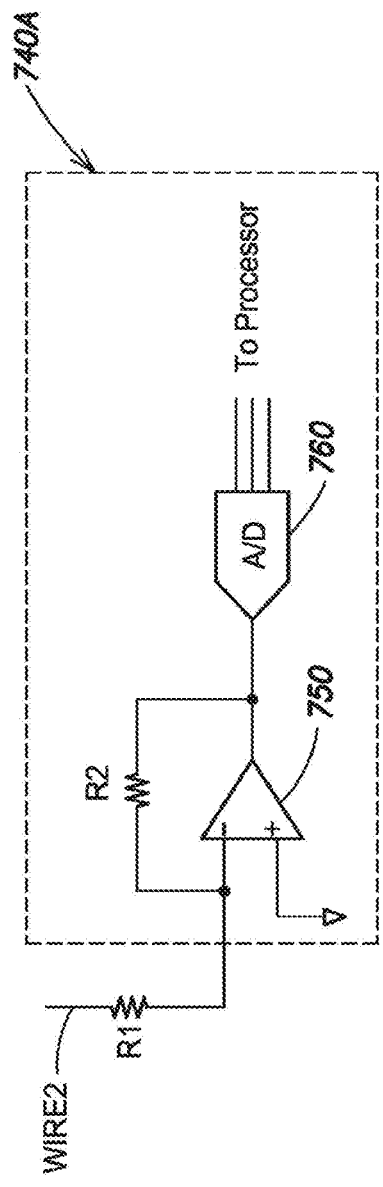
FIGS. 7A and 7B illustrate alternate embodiments of techniques for measuring voltage in a system using a resistive element.
Figure 7B:
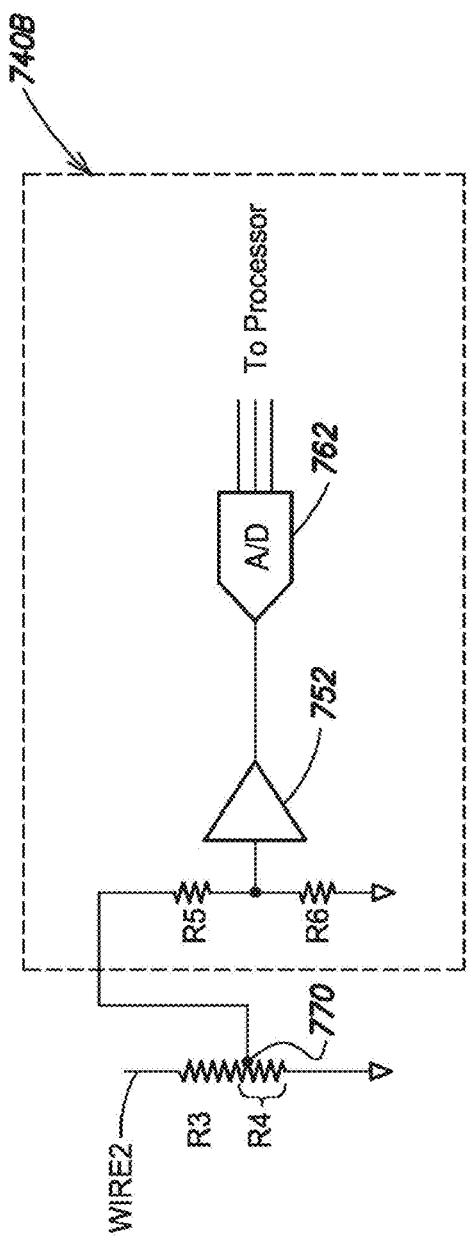

FIGS. 7A and 7B schematically illustrate measurement circuitry for measuring a voltage between wires of a power line using a resistive element as described herein. FIG. 7 illustrates measurement circuitry 740A, which may represent voltage measurement circuitry forming a portion of sensors 40 (FIG. 4) or sensors 74 (FIG. 6).

In the embodiment illustrated, measurement circuitry 740A includes an operational amplifier 750. Operational amplifier 750 is connected in a negative feedback configuration through a resistor R2 coupling its output terminal to its negative input terminal. The positive input terminal of operational amplifier 750 is coupled to the common voltage, which may be the voltage of the wire to which the measurement unit containing measurement circuitry 740A is attached.

FIG. 7A shows that the negative input terminal operational amplifier 750 is also coupled to a second wire, WIRE2, through a resistor R1. Resistor R1 may represent a distributed resistive element, examples of which have been described, such as resistive elements 18, 22, or 24 (FIG. 4) or resistive elements 64, 66 or 68 (FIG. 6).

The output of operational amplifier 750 is coupled to A/D converter 760. The output of A/D converter 760 is in turn coupled to a processor. That processor, for example, may be a controller of a sensor unit, such as controller 44 (FIG. 4) or controller 82 (FIG. 6). As a result of this connection, the processor may use the value at the output of operational amplifier 750 in computing the voltage between WIRE2 and the wire to which the sensor unit is attached.

In the configuration shown in FIG. 7A, the output of operational amplifier 750 may depend on the voltage on WIRE2 with respect to the common voltage to which operational amplifier 750 is referenced and the ratio of the values of resistors R1 and R2. The processor processing the output of operational amplifier 750 may be programmed with or may access computer storage locations storing information representing the values of resistors R1 and R2. In embodiments in which the computation is formed based on the ratio of the values of resistors R1 and R2, information about the values of those resistors may be stored as a ratio. Though, information about the values of the resistors may be stored in any suitable form, as aspects of the disclosure provided herein are not limited in this respect.

In some embodiments, the resistor R2 may be a precision resistor such that the value of resistor R2 may be determined from the rated values of the components used for resistor R2. Similarly, the resistive element represented by resistor R1 may be a precision resistor. For example, a resistive element manufactured using the techniques described with reference to FIGS. 3A and 3B may have a value that can be determined based on the construction of the resistive element. Accordingly, in some embodiments, information about the values of resistors R1 and R2 may be determined from rated values of the components used to construct the resistors. In other embodiments, values of the resistors, or the ratio of the resistors may be measured.

Regardless of how information about the values of resistors R1 and R2 is determined, a processor receiving the output of A/D converter 760 may use this information to convert the output of operational amplifier 750 to a value representing the line voltage to be measured. In the embodiment illustrated, this computation may entail applying a known formula for the gain of an operational amplifier, in the configuration of operational amplifier 750. By scaling the measured value by the inverse of the gain, the line voltage may be computed.

In the embodiment illustrated in FIG. 7A, the value of resistor R2 may be small (e.g., smaller or much smaller) in comparison to the value of resistor R1. A small value may lead to a gain that is much less than 1. A specific value may be chosen so that the output of operational amplifier 750 does not saturate either operational amplifier 750 or A/D converter 760 at voltage levels expected on WIRE 2. For example, the value of resistor R1 may be on the order of 50 MOhms and the value of R2 may be on the order of a few KOhms, depending on the expected voltage to be measured on WIRE 2.

FIG. 7B illustrates an alternative embodiment of measurement circuitry that may be used in a sensor unit as described herein. FIG. 7B illustrates measurement circuitry 740B. As with measurement circuitry 740A, measurement circuitry 740B makes a measurement relative to a common voltage, which may be established by a wire, WIRE1, of a power line. In the embodiments illustrated in FIGS. 4 through 6, that common voltage is established by the wire to which a sensor unit containing the measurement circuitry is attached. Though, it should be appreciated that the common voltage may be established in any other suitable way.

Figure 8:
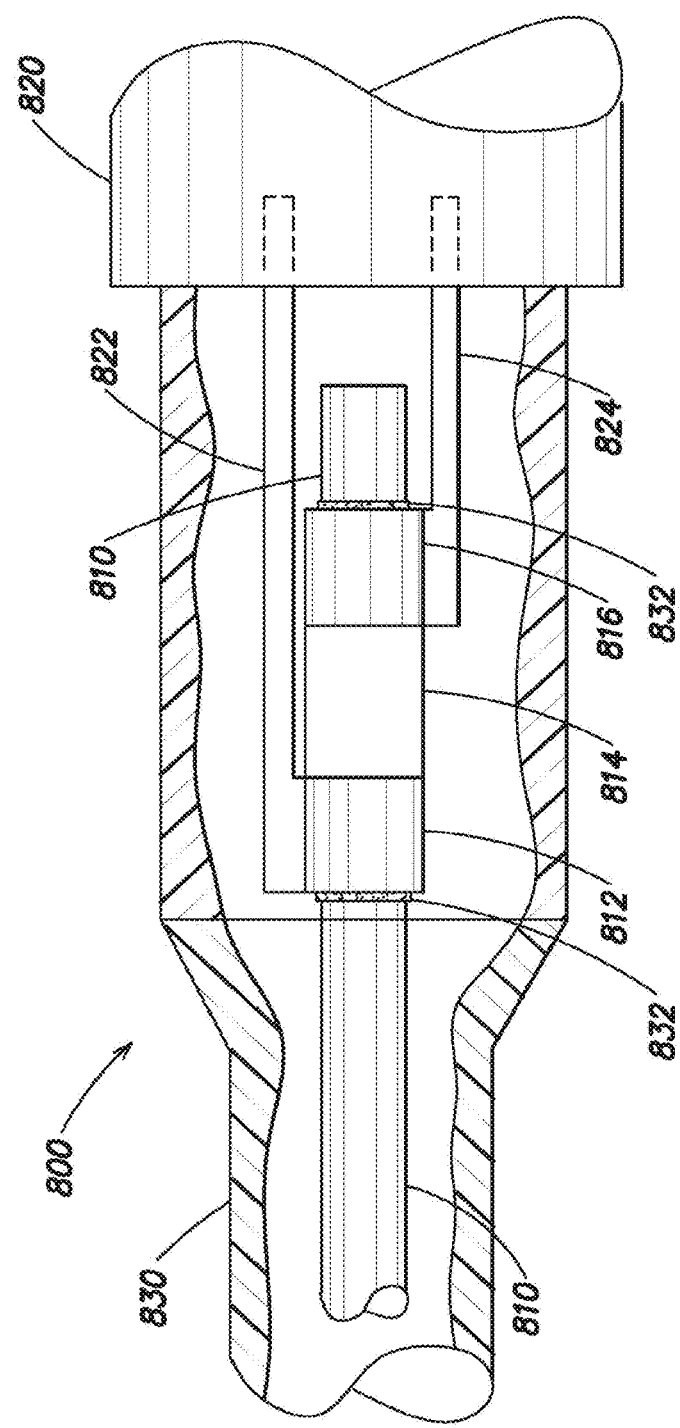
FIG. 8 is a sketch of an exemplary technique for manufacturing a distributed resistive element having a tap near its end.

Measurement circuitry 740B, like measurement circuitry 740A, is connected to a distributed resistive element spanning to a wire, WIRE2, of a power line. The distributed resistive elements may be fabricated using techniques as described herein or in any other suitable way. In the example given in FIG. 7B, the distributed resistive element has a tap near one end. FIG. 8 provides an example of a construction technique suitable for forming a distributed resistive element with a tap.

Regardless of the manner in which the distributed resistive element is formed, FIG. 7B illustrates that the resistive element is divided by tap 770 into two portions, a first portion represented by resistor R3 and a second portion represented by resistor R4. The end of the resistive element adjacent resistor R4 is coupled to the common reference potential. The end of the resistive element adjacent resistor R3 is coupled to WIRE2. This configuration creates a resistive voltage divider at tap 770 in which the voltage at tap 770 depends on the ratio of resistors R3 and R4 and the voltage difference between WIRE2 and the common reference potential.

In some embodiments, tap 770 may be placed sufficiently close to the end of the resistive element that resistor R4 is a very small relative to resistor R3. In such a configuration, the voltage at tap 770 may be small, even when the voltage difference between WIRE2 and the common reference potential is large. If the voltage at tap 770 is small enough to measure without saturating components within measurement circuitry 740B, that voltage may be measured, digitized in A/D converter 762 and provided to a processor. That processor may then scale the measured value based on the resistive voltage divider established by resistors R3 and R4 to compute the voltage difference between WIRE2 and the common reference potential.

As with other embodiments, information on the values of resistors R3 and R4 may be determined from rated values of the resistors or parameters of construction of the components used to construct the resistors or by measurement.

In some embodiments, physically positioning a tap on a distributed resistive element to yield a sufficiently small voltage at tap 770 may increase manufacturing costs or pose other challenges. In the embodiment illustrated in FIG. 7B, tap 770 is positioned from the end of the distributed resistive element by a distance that simplifies manufacture of the distributed resistive element, but yields a voltage at tap 770 that might saturate components in measurement circuitry 740B. In this embodiment, a secondary resistive voltage divider, formed by resistors R5 and R6, is included as an input stage to measurement circuitry 740 B. The secondary resistive divider decreases the voltage measured at tap 770 before it is supplied as an input to operational amplifier 752.

In this example, operational amplifier 752 is configured as a buffer amplifier, providing unity gain. Though, it should be appreciated that operational amplifier 752 may have any suitable gain. The output of operational amplifier 752 is provided to A/D converter 762, which produces a digital representation of the measured voltage. That digital representation may then be provided to a process or in a computation to determine the voltage between WIRE2 and the common reference voltage.

In the example illustrated in FIG. 7B, the computation may entail scaling the measured voltage by a value dependent on the secondary voltage divider provided by resistors R5 and R6 and the primary voltage divider provided by resistors R3 and R4. As previously described, information about the values of resistors R3, R4, R5 and R6 may be determined in any suitable way. These value information relating to resistors R3 and R4, for example, may be determined at the time of construction of the distributed resistive element. This value information may take the form of measuring or computing the ratio of the resistive voltage divider created by those resistors. Likewise, value information for resistors R5 and R6 may be determined at the time of the construction of measurement circuitry 740B by measuring or computing the ratio of the resistive voltage divider created by those resistors.

In some embodiments in which the accuracy of voltage measurements depends on values or ratios of resistive elements, value information may be periodically updated after a sensor unit is deployed. This updating may take the form of a field calibration. Such calibration may be performed at periodic intervals or may be performed in response to changing conditions, such as temperature. Though, in some embodiments, stable components or stable construction techniques may be used to reduce the need or frequency of performing such a calibration.

For example, in the embodiment illustrated in FIG. 7B, voltage measurements depend on the ratio of resistive elements R3 and R4 and separately on the ratio of resistive elements R5 and R6. In this scenario, resistive elements R3 and R4, because they are formed from a single distributed resistive element, may have the same construction and will be exposed to the same environmental conditions. Therefore resistors R3 and R4 should exhibit comparable stabilities. As a result, if the value of resistor R3 changes in response to temperature or other environmental conditions, the value of resistor R4 likely will change proportionately, thereby maintaining the ratio used in computing a voltage measurement. Similarly, resistors R5 and R6 may be similar components and may be mounted similarly within a measurement unit. As a result, these components may be exposed to similar environmental conditions and should exhibit similar stabilities. As a result, ratio based on resistors R5 and R6 used in computing a voltage measurement may be stable, leading to accurate voltage measurements.

Turning to FIG. 8, an example of a distributed resistive element configured with a tap is provided. FIG. 8 shows an end of resistive element 800 configured with a connector 820 for connection to a sensor unit. Connector 820 provides a contact defining an end of the resistive element and a tap near that end.

In the embodiment illustrated in FIG. 8, resistive element 800 is formed using techniques as are known in the art for construction of cable assemblies. The assembly formed around a resistive member. In this example, the resistive member is a plastic rod. That rod may be flexible, having, for example, a bend radius such that the rod may be formed into a coil of approximately 1 foot in diameter. Though, it should be appreciated that the mechanical properties of the plastic rod may vary, depending on the intended operating environment of resistive element 800, and the specific mechanical properties are not critical to the invention.

Plastic rod 810 may be imparted with a resistance in any suitable way, including by doping or coating the rod. In the illustrated embodiment, resistive ink is coated on a plastic rod. The ink may be applied to a thickness that provides a suitable resistance, for example, ⅛ of an inch or 3/16 inch.

Though, it should be appreciated that the resistance may vary, depending on the intended operating environment of resistive element 800.

Plastic rod 810 may be covered with a jacket 830, as in a conventional cable assembly. The jacket may include a fibrous wrap such as a fiberglass or Kevlar wrap. An outer layer may be resistant to the elements and may provide a protective sheath, as in a conventional cable assembly.

Connector 820 may be attached to an end of a cable in any suitable way. As an example, the protective sheath may be stripped from one end of the cable. The fiberglass coating may be peeled back to expose an end of plastic rod 810. Conductive elements, defining a tap and an end of the resistive element, may then be attached to the exposed end of plastic rod 810.

In this example, conductive element 812 defines the tap and conductive element 816 defines the end of the resistive element. Conductive elements 812 and 816 each have a tubular portion designed to slide over the end of plastic rod 810. These tubular portions may be attached to the resistive coating on plastic rod 810, forming connections to the resistive element.

Any suitable mechanism may be used to form the connection between conductive elements 812 and 816 and the resistive coating on plastic rod 810. For example, the tubular portions may be deformed, such as by crimping, to engage plastic rod 810. Alternatively or additionally, an adhesive may be used to secure conductive elements 812 and 816. The adhesive, for example, may be epoxy 832, which may be conductive or nonconductive.

Regardless of the manner in which conductive elements 812 and 816 are connected to plastic rod 810, spacer 814 may be inserted between conductive elements 812 and 816 to establish spacing between the conductive elements. When resistive element 800 is used with measurement circuitry as illustrated in FIG. 7B, the length of spacer 814, in combination with the resistance per unit length of plastic rod 810, may establish the value of resistor R4. Accordingly, spacer 814 may have a length selected to provide a desired value of resistor R4. As a specific example, spacer 814 may have a length of approximately one quarter of an inch.

Spacer 814 may be constructed in any suitable way. Spacer 814, for example, may be made of an insulative material, such as rubber. Spacer 814 may be attached to plastic rod 810. Alternatively or additionally, spacer 814 may be tubular with dimensions allowing it to slide over plastic rod 810. Spacer 814 may be captured between the tubular portions of conductive elements 812 and 816.

Each of the conductive elements 812 and 816 includes a projecting portion, 822 and 824, respectively. Projecting portions 822 and 824 extend to connector 820, where they serve as conductive contacts. Mating contacts from a complementary connector on a sensor unit (or other component to which distributed resistive element 800 is connected) may make electrical contact with projecting portions 822 and 824. When resistive element 800 is used in an embodiment as illustrated in FIG. 7B, projecting portion 824 may serve as the common terminal for connector 820. Projecting portion 822 creates a terminal at which a line voltage may be measured.

For robustness, the end of resistive element 800 may be overmolded with plastic or other material to encapsulate the tubular portions of conductive elements 812 and 816. The overmolding operation may also be used to form the body of connector 820, with projecting portions 822 and 824 exposed from a mating face of connector the 20.

The fiberglass coating that was peeled back to expose the end of plastic rod 810 may also be captured in the overmold, thereby securing connector 820 to the rest of the cable assembly. Though, any suitable techniques, including those known in the art of cable assembly, may be used to secure cable 822 plastic rod 810.

FIG. 8 provides an example of techniques that may be used to manufacture a tapped resistive element. In distributed resistive element 800, the resistive portions on both sides of the tap are formed of similar materials. Accordingly, the ratio of the resistive voltage divider formed by measuring a voltage at the tap of resistive element 800 with respect to the common terminal is stable and is established at the time of manufacture of distributed resistive element 800. Accordingly, in some embodiments, this ratio may be measured at the time of construction of resistive element 800 and provided to a process or processing measurements made using resistive element 800.

Having thus described several aspects of at least one embodiment of this invention, it is to be appreciated that various alterations, modifications, and improvements will readily occur to those skilled in the art.

For example, embodiments are described in connection with a power distribution system used to deliver power from generation facilities to consumers of that power. However, the techniques described herein may be applied to transmission and distribution conductors in any other suitable setting. For example, techniques described herein may be used to obtain measurements of electrical properties of power lines used by the railway and streetcar industries or of high-voltage conductors used in subway systems.

Also, it should be appreciated that FIG. 8 illustrates a specific technique for terminating a distributed resistive element at an end configured to connect to a sensor unit. Resistive elements constructed in other ways may be terminated to provide a tap and a distal connection point. For example, a tap may be incorporated into a construction as illustrated in FIG. 3A by making a connection to a trace between two of the resistors.

As yet another example, it should be appreciated that the measurement techniques described herein are exemplary and not limiting. Though measurements are described as being made based on ratios of resistances, in some embodiments the actual value of a distributed resistive element may be determined and used in computing a voltage measurement. When the actual value of the resistance of the distributed resistive element is known, current through the distributed resistive element may be measured. Based on this current measurement and known resistive value, a voltage drop across the resistive element may be determined. This voltage drop may be added to measured voltage between the end of the distributed resistive element and a point in the power distribution system where voltage is to be measured.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Additional output devices may include other operational support systems used by a utility to monitor and control their network. Examples of the uses of output from this system could be control of voltage regulators, control of capacitor banks, power consumption data for billing systems, output into outage management systems, or output into fault location isolation and restoration (FLIR) systems. Interfaces into these other operational support systems may include proprietary data interfaces or industry standard protocols such as DNP-3 or IEC 61850. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Figure 9:
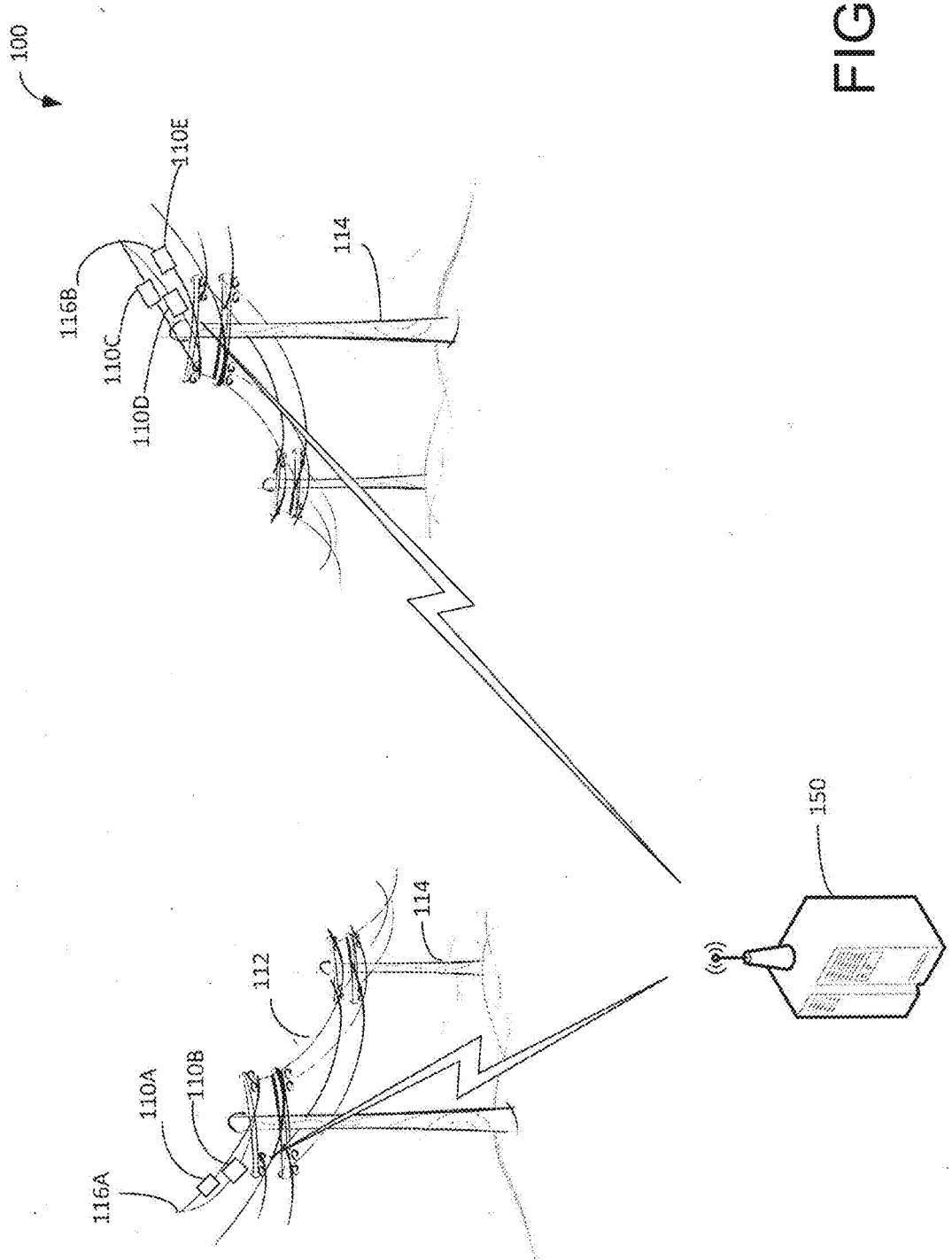
FIG. 9 is a schematic illustration of a power distribution system equipped with components for sensing and measuring at least one voltage-related property of a power line.

FIG. 9 illustrates an environment in which the techniques described herein for sensing and measuring a voltage on a power line may be applied. In this example, FIG. 9 illustrates a power distribution network 100 that includes multiple overhead power lines 112. The overhead lines may be supported by towers and/or poles 114. As a result, each of the power lines 112 may have multiple segments, such as segments 116A and 116B, between the locations where the wires are attached to the towers and/or poles.

Sensor units may be attached to some or all of the power line segments. In the example illustrated in FIG. 9, sensor units 110A and 110B are shown as being attached to segment 116A of lines 112 and sensor units 110C, 110D, and 110E are shown as being attached to segment 116B of lines 112. In this example, sensor units are attached to a subset of the power line segments. Though, in some embodiments, a sensor unit may be attached to every power line segment; in other embodiments, sensor units may be selectively attached to power line segments. For example, sensor units may be selectively attached to power line segments that have characteristics representative of power line segments in a larger area (e.g., such line segments may be in locations having environmental conditions representative of environmental conditions of other line segments in a larger area). As another example, sensor units may be placed selectively on power line segments that are in locations carrying a greater risk of failure, such as windy locations, or posing a greater risk to people or objects below the power line segments if a failure should occur, as the case may be for power line segments spanning busy intersections. Thus, it should be appreciated that the number and locations of sensor units within power distribution network 100 is not critical to the invention.

A power line segment may comprise one or multiple wires. When a power line segment comprises multiple wires, the wires may be associated with different phases. For example, a power line segment may comprise three conductors; such a power line segment may be referred to as a three-phase line.

A sensor unit may be attached to one or multiple wires in a power line segment. A sensor unit may be attached to each of one, or two, or all three of the conductors in a three-phase line. For example, there may be two sensor units attached to a power line segment. In the example illustrated in FIG. 9, power line segment 116A is a three-phase line with sensor units 110A and 110B attached to different conductors. In the example illustrated in FIG. 9, power line segment 116B is a three-phase line with sensor units 110C, 110D, and 110E attached to different conductors in the power line segment.

It also should be appreciated that FIG. 9 shows a simplified representation of a power distribution system. A power distribution system may have many more poles and/or towers and many more power lines than illustrated. FIG. 9 illustrates power lines located overhead. In some embodiments, sensor units may be attached to power lines located underground (not shown), and FIG. 9 should be regarded as illustrative rather than limiting of environments in which a sensor unit may be installed. Moreover, FIG. 9 illustrates medium voltage lines. In some embodiments, sensor units may be preferentially attached to medium voltage lines because of the proximity of medium voltage lines to trees and other objects that could come into contact with the power lines. Medium voltage power lines also may be well suited for placement of sensor units because of the proximity of those lines to people or other objects that could be injured or damaged if a fault were to occur on such a line. Though, it should be appreciated that the specific type and structure of the lines to which sensor units are attached is not critical to the invention. Sensor units may be attached to any suitable type of line, including cables of various types.

Regardless of the numbers and locations of sensor units in the power distribution network, data collected at each sensor unit may be communicated to one or more computing devices for processing to determine a condition, on one or more of the power lines, indicating a current or predicted need for maintenance, for example. In the example of FIG. 9, data from the sensor units is wirelessly communicated to controller 150. In this example, controller 150 is illustrated as a single computing device collecting data from all of the sensors. Though, it should be appreciated that in a power distribution network spanning a large area, multiple computing devices may be used to collect and process data from the sensors. Any suitable one or more computing devices may be used to collect data from the sensors. The computing device may include components and/or data applications, such as databases, management systems, and/or short message service (SMS), that receive communications from and/or send communications to the sensor units.

If multiple devices are used, they may be located in one location or distributed across multiple locations. In the latter case, they may be connected through a network and/or organized hierarchically such that each computing device in the hierarchy may be configured to collect and process data gathered by a subset of sensor units. For example, one computing device may be configured to collect and process data from sensor units in one geographic region and another computing device may be configured to collect and process data from sensor units in another geographic region.

FIG. 9 also shows data being transmitted directly from each sensor unit to controller 150. In some embodiments, the data may be transmitted through one or more intermediary devices. Moreover, FIG. 9 illustrates wireless communication as an example of a communications mechanism that may be employed. Any suitable communication mechanism may be used. For example, in some embodiments, the data may be communicated in whole or in part over the power lines themselves. As a specific example, a sensor unit connected to a central data collection point, such as controller 150, through a power line, may transmit data over that power line. If a fault or other condition prevents or hinders communication over the power line, the sensor unit may transmit data wirelessly to the central location directly or indirectly through another sensor unit or other suitable intermediary device. Accordingly, it should be appreciated that the specific communications mechanism employed is not critical to the invention.

In some embodiments, different types of sensor units may be deployed as part of a monitoring system. The deployed sensor units may have different hardware capabilities and may be deployed throughout the power distribution network based on their capability. For example, in some embodiments, high-fidelity sensor units (e.g., sensor units capable of obtaining measurements at a high rate, having more processing power, etc.) may be deployed at one or more locations in the power distribution network. Additionally, multiple lower fidelity sensor units (e.g., sensor units capable of obtaining measurements at a lower rate than the highfidelity sensor units, having less processing power than the high-fidelity sensor units, etc.). Such a hierarchical architecture may reduce the cost of a monitoring system by avoiding the cost associated with installing high-fidelity sensor units in locations where lower fidelity sensor units may be sufficient.

Each sensor unit may contain one or more types of sensors and circuitry for controlling the collection of data and transmission of that data for analysis. In some embodiments, each sensor unit may contain circuitry for processing the data prior to transmission. The processing may, for example, result in the encryption and/or compression of the collected data to reduce the amount of data transmitted. Any suitable type of data compression techniques may be used. Data may be compressed by using lossless or lossy compression techniques, or any suitable combination thereof. Data may be compressed, for example, by extraction of features or parameters characterizing signals measured by sensors including any time-varying signals measured by the sensors. A further form of compression may entail transmission of samples of sensor data from time to time.

The times at which sensor data is transmitted may be periodic, randomized, and/or may be dynamically determined based on detection of changing conditions. For example, sensor data may be transmitted when there is a change in the environmental conditions (e.g., a snowstorm arrives, a tree falls, it becomes windy, etc.).

Figure 10:
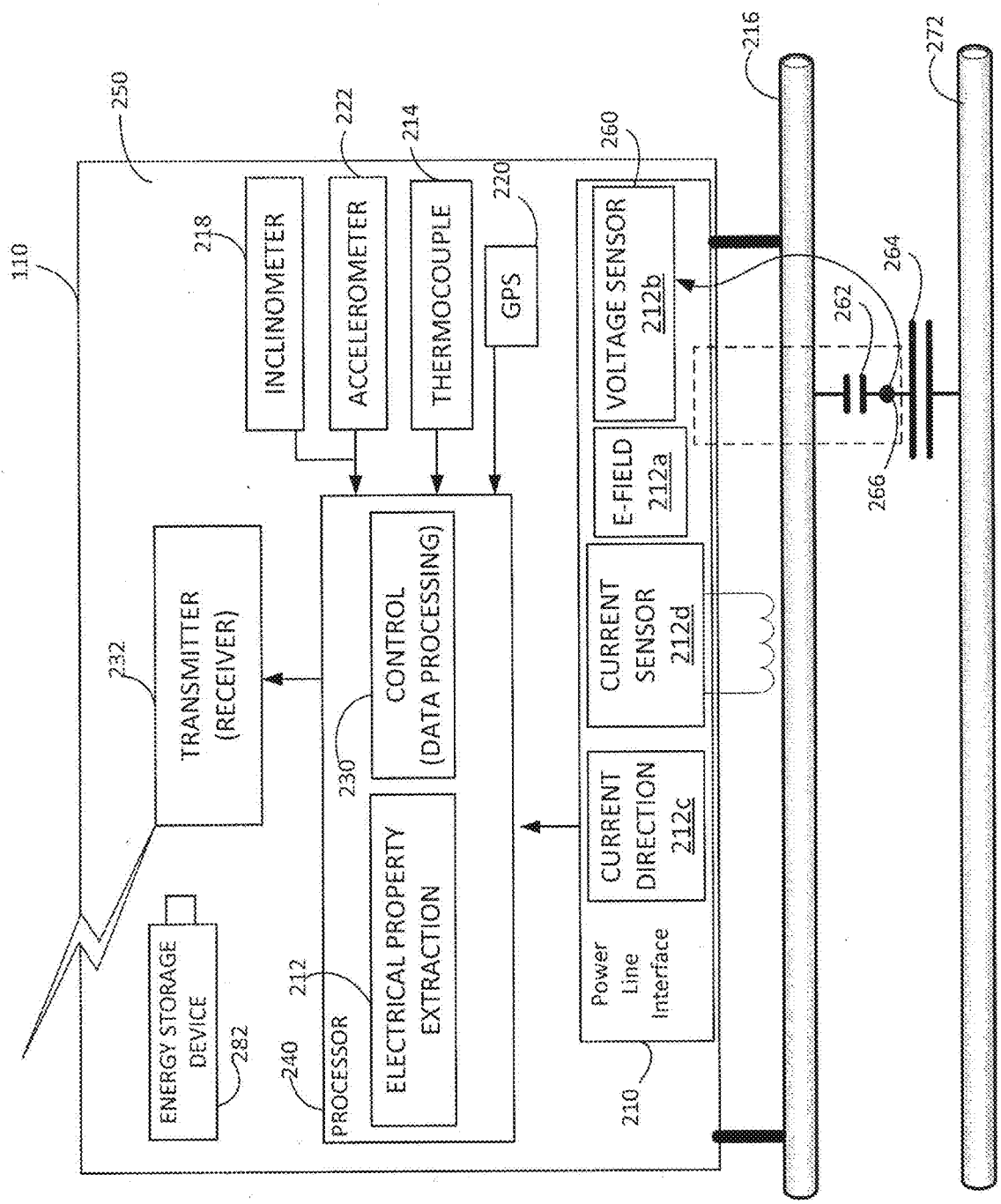
FIG. 10 is a functional block diagram of a sensor unit in accordance with some embodiments of a system for sensing and measuring at least one voltage-related property of a power line.

FIG. 10 illustrates an exemplary sensor unit 110. Here, sensor unit 110 is shown as being mechanically attached to line segment 216. The mechanical attachment is shown schematically in FIG. 10. Any suitable mechanical attachment technique, including clamps, adhesives or any other suitable mechanisms, may be used to attach each sensor unit to a line segment.

Each sensor unit may contain a housing 250 that is environmentally sealed. Such a housing may be manufactured with any suitable materials, including materials as are used in the art for components used in exterior locations, such as may be found in power distribution systems and/or telephone systems.

Sensors and control circuitry may be enclosed within the housing 250. One or more types of sensors may be included in a sensor unit. In the example illustrated in FIG. 10, sensors for measuring electrical and mechanical properties are both included in sensor unit 110. A power line interface 210 may be included to sense electrical properties on line segment 216. In some embodiments, power line interface 210 may include components for sensing those electrical properties without direct electrical connection to line segment 216. For example, capacitive or inductive coupling between power line interface 210 and line segment 216 may be employed.

Regardless of the specific mechanism used to electrically couple sensor unit 110 to line segment 216, sensor unit 110 may include circuitry 212 for extracting electrical properties of the line segment. To this end, circuitry 212 may include one or more sensors configured to extract electrical properties. For example, circuitry 212 may include electric field sensor 212*a*, voltage sensor 212*b*, current direction sensor 212*c*, and current sensor 212*d*. In some embodiments, voltage sensor 212*b* may be configured to detect voltage harmonics on the line, among other power-related properties. Though, it should be recognized that circuitry 212 may include and/or be coupled to any suitable sensor for determining electrical properties. Circuitry 212 may use techniques as are known in the art to determine electrical properties, such as voltage or current on line 216. In this way, circuitry 212, in combination with power line interface 210, may act as a sensor for electrical properties.

Other mechanical properties may be measured. For example, FIG. 10 shows that sensor unit 110 includes thermocouple 214. Thermocouple 214 may be configured to measure the temperature of line 216 and output a signal reflecting the temperature. Additionally or alternatively, thermocouple 214 may measure the outside ambient temperature. Yet further sensors may be configured to measure inertial properties of line segment 216. In this example, inclinometer 218 and accelerometer 222 are included for measuring inertial properties. Because these sensors are coupled through housing 250 to line segment 216, the inclination or acceleration measured by these sensors reflect conditions on line segment 216. The inertial sensors may be constructed using techniques as are known in the art. For example, such sensors may be manufactured using microelectronic manufacturing techniques. Though, it should be appreciated that the specific construction of the inertial sensors is not critical to the invention.

Regardless of how the sensors may be constructed, inclinometer 218 may output a signal representing a tilt of inclinometer 218, which, because of the mechanical coupling through housing 250 to line 216, may represent an amount of sag on line 216. Similarly, the output of accelerometer 222 may reflect acceleration on line 216. Other inertial sensors, such a sensor for velocity, alternatively or additionally may be included within sensor unit 110. Though, in some embodiments, other inertial measurements, such as velocity, may be derived from one or more of the inertial measurements made. For example, velocity may be derived through computations on outputs produced by accelerometer 222.

It should be appreciated that any of the above-mentioned sensors may be used to measure any of the above-described properties at any suitable time. Each sensor may measure properties that the sensor is configured to measure multiple times such that the sensor may produce a time-series of measurements of a time-varying characteristic. For example, thermocouple 214 may be configured to produce a time-series of temperature measurements. As another example, circuitry 212 may be configured to produce a time-series of measurements of a particular electrical property.

It should be appreciated that sensor unit 110 may comprise any of numerous other types of sensors in addition to or instead of the above-described sensors. For example, sensor unit 110 may comprise a GPS receiver such as GPS receiver 220 configured to obtain location and/or precision time information.

Regardless of the number and types of sensors within sensor unit 110, the outputs of the sensors may be collected by control circuitry 230, which in the embodiment illustrated is located within processor 240. Control circuitry 230 may be implemented using circuitry design techniques as are known in the art. Control circuitry 230, for example, may be implemented as a programmable logic device programmed to perform techniques as described herein. In other embodiments, control circuitry 230 may be a general-purpose microcontroller or other processor that may be programmed through instructions stored in nonvolatile memory. As another option, control circuitry 230 may be custom-designed circuitry such that it is programmed to perform the processing described herein based on the layout of circuit elements in the circuitry.

Regardless of the specific construction of control circuitry 230, control circuitry 230 may be configured to collect data from the sensors within sensor unit 110 and control transmitter 232 to transmit that data. In the example of FIG. 9, transmitter 232 may be configured to transmit data in accordance with a protocol recognized by controller 150. In some embodiments, control circuitry 230 may process the data collected from the sensors prior to transmission.

That processing may include data compression or other processing operations. As one example, the processing may include time-domain, frequency-domain, time-frequency domain, and/or time-scale domain analysis on time-varying outputs of one or more sensor units. For example, performing time-scale domain analysis may include performing a multi-resolution transformation via a wavelet transformation as is known in the art. In some embodiments, the processing may be performed in accordance with a time-invariant wavelet transformation. The transformation may be a discrete-time wavelet transformation. Such a transformation may generate one or more transform coefficient values representing a signal collected at the output of a sensor such that transmission of the coefficients may convey useful information in the signal, but may consume a much lower bandwidth upon transmission. Though, it should be appreciated that any other suitable signal processing techniques (e.g., Fourier techniques, Gabor analysis, discrete cosine transform, etc.) may be applied to the outputs of the sensors.

Alternatively or additionally, processing may include tagging data prior to its transmission. The data may be tagged in any suitable way, such as by including data to indicate the sensor unit at which the data was collected or the line segment for which the data is collected. Tagging may also indicate any suitable information associated with the sensor unit, such as the location of the sensor unit. Tagging may also indicate a time at which the data was collected or any other parameters useful in analyzing the data including, but not limited to, parameters indicating how the data may have been processed prior to transmission.

FIG. 9 shows data being sent uni-directionally, from sensor units to a computing device. In some embodiments, two-way communication may be supported. In those embodiments, transmitter 232 may be a portion of a radio that also operates as a receiver. In such embodiments, transmitter 232 may be a transceiver. Information received may represent commands to sensor unit 110 to trigger sensor unit 110 to perform functions that it is already configured to perform or to reconfigure sensor unit 110 to perform additional functions. Commands received over a communications link, for example, may trigger sensor unit 110 to collect and/or report sensor measurements. Though, the specific commands to which sensor unit 110 may respond are not critical to the invention, and sensor unit 110 may be configured to respond to any suitable commands.

Sensor unit 110 may include electrical components configured to facilitate measurements made by circuitry 212. These components may be active components, such as voltage or current measuring circuits, or passive components, such as capacitors or resistors. For example, sensor 110 may include capacitor 262. Capacitor 262 may be located in any suitable place to facilitate measurements made by circuitry 212. Capacitor 262 may be housed within sensor 110 as indicated by the dashed box. Alternatively, capacitor 262 may be mounted outside the housing 250 of sensor 110, or located adjacent to or separate from the housing 250 of sensor unit 110.

Capacitor 262 may be connected to form a portion of a capacitive voltage divider. As shown, an electrode of capacitor 262 is connected to line 216. Another electrode of capacitor 262 may be connected to tap 266, to which an electrode of capacitor 264 is also connected. As shown, another electrode of capacitor 264 is connected to line 272. Line 272 may be a neutral wire and line 216 may be a hot wire, such that the capacitive voltage divider formed by capacitors 262 and 264 may provide a measurement of voltage between the neutral and hot wires. By appropriately sizing the capacitors, a nominal voltage on the order of 600 volts may be present at the tap 266 when the hot wire is a medium voltage line. Though such a configuration entails a voltage drop of approximately 29,000 Volts across capacitor 264, because that capacitor is external to the sensor unit, it may be sized for such voltages. Such capacitors are used in connection with power for power conditioning, and could be adapted for a measuring circuit as shown. A capacitor, with the capacitance required for a voltage divider as described above and capable of handling in excess of 600 Volts, may be of a size suitable for inclusion within the housing 250.

Tap 266 may serve as a measurement point of the capacitive voltage divider formed by capacitors 262 and 264. That tap may be implemented in any suitable way. In some embodiments, sensor unit 110 may include a port adapted for connection of an external capacitor, such as capacitor 264. Connections to tap 266 may be implemented by making connections to the port.

Power line interface 210 may include direct or indirect connections from the sensors to various measurement points, including tap 266. These connections may be hard-wired, but physical contact is not necessary depending on the type of sensor and type of measurement to be made. Measurement points may be located within the housing 250. Alternatively, connections may be made to measurement points outside of housing 250. For example, voltage sensor 212b may include a connection to a tap 266, which may be located within or outside the housing 250 as indicated by the dashed box.

It should be appreciated that FIG. 10 is a simplified representation of a sensor unit. Other components may alternatively or additionally be included. For example, FIG. 10 illustrates that sensor unit 110 includes at least one power source, one of which is illustrated as charge storage device 282 in FIG. 10. The at least one power source may serve as a standby power source. Charge storage device 282, for example, may be a battery or a super capacitor. However, any suitable power source alternatively or additionally may be included.

Figure 11B:
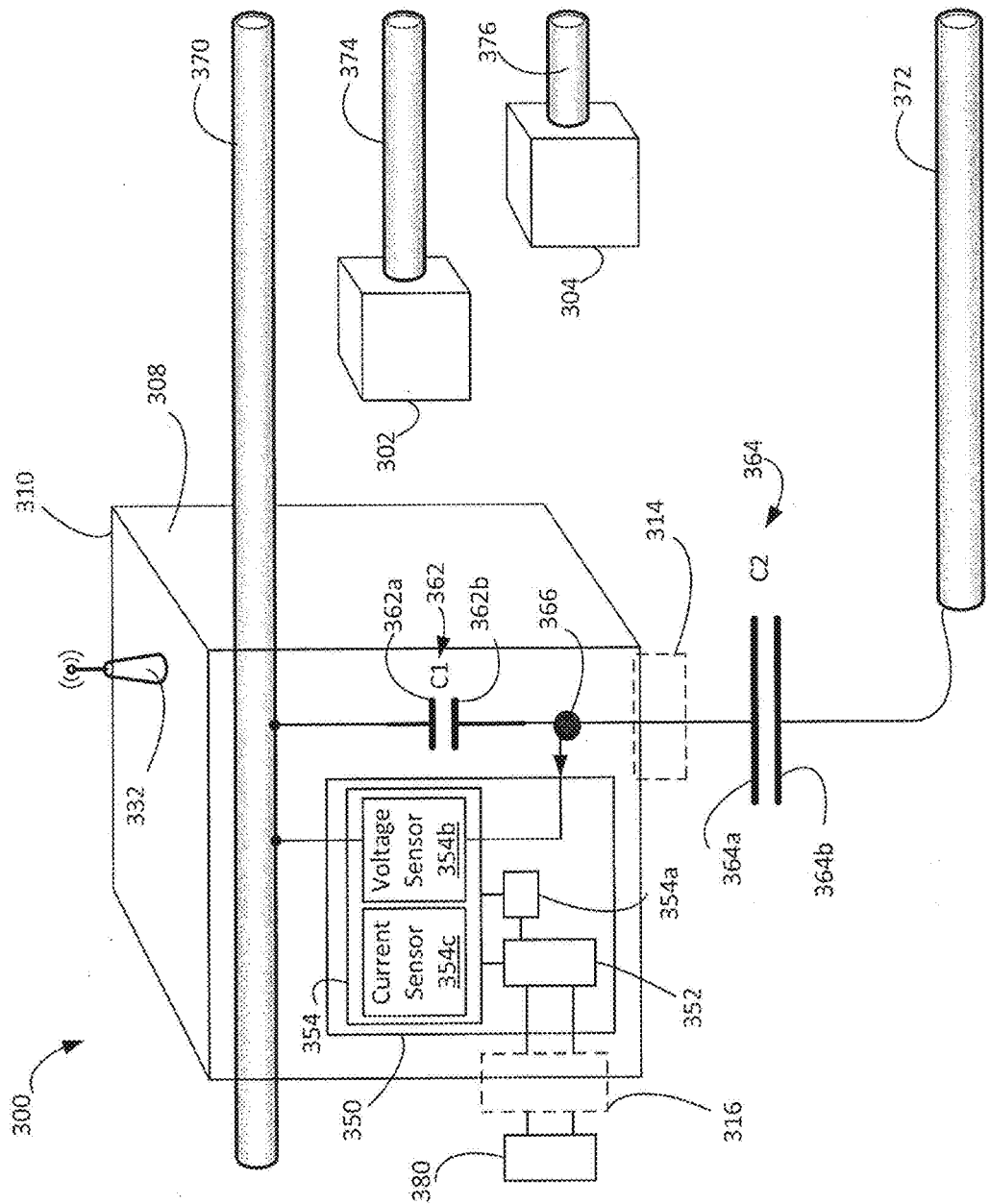
FIG. 11b is a schematic illustration of a sensor configuration in accordance with some embodiments of a system for sensing and measuring at least one voltage-related property of at least one phase of a power line.
Figure 11C:
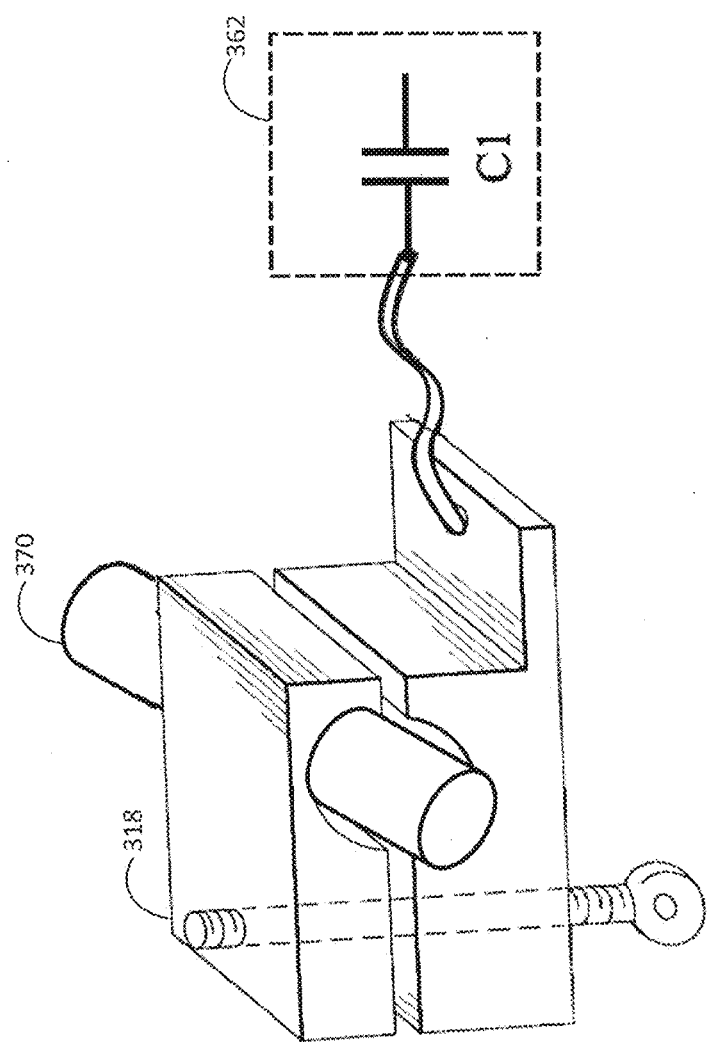
FIG. 11c is a schematic illustration of a mechanical configuration for connecting a power line to a portion of a sensor unit.

FIG. 11a-11c illustrate an embodiment of a sensor unit 310 deployed in an overhead power distribution system. Sensor unit 310 may be attached to a hot wire 370 of a power line. Sensor unit 310 may include an opening 312 so that the wire can pass through the sensor unit housing 308, allowing for mechanical and electrical connection to the wire. Sensor unit 310 may be attached to the wire in any suitable way. For example, sensor unit 310 may be mechanically attached to the power line using a clamp 318, as illustrated in FIG. 11c. Additionally and/or optionally, clamp 318 may be made of any suitable conductive material to create an electrical connection between hot power wire 370 and sensor unit 310. For example, clamp 318 makes an electrical connection to the first electrode of a first capacitor 362 as illustrated in FIG. 11c. It should be appreciated that a clamp is one mechanism to mechanically and electrically attach a sensor unit to a wire. In some embodiments, different mechanisms may be used for electrical and mechanical attachment. In some embodiments, for example, electrical connection may be made vie a ground lead disconnect bullet or a cutout fuse may alternatively be wired in.

Sensor unit 310 may include a plurality of ports in housing 308 for interfacing with components used in making measurements or other functions. For example, sensor unit may include port 314 through which a second, larger capacitor 364 is connected to measurement circuitry in side sensor unit 310. As another example, sensor unit 310 may contain a port for connecting external devices as indicated by the dashed box 316 in FIG. 11b. Such a port may be used, for example, to provide power to the external device. Sensor unit 310 may contain any number of additional ports to facilitate measuring electrical properties of power lines, communicating data and/or powering external devices.

Sensor unit 310 may also be attached to other power lines either directly or indirectly. For example, sensor 310 may be connected to a neutral power line 372 via a second capacitor 364. Capacitor 364 may be connected to neutral wire 372 in any suitable way. For example, conductive wire 378 may be used to connect an electrode of the second capacitor to the neutral wire 372.

FIG. 11a shows a single sensor attached to a single conductive wire. It should be appreciated that, in a power distribution system, multiple sensor units may be deployed. Multiple sensor units may be used to make measurements at multiple locations. Additionally, multiple sensor units may be used at a single location to measure electrical properties on different wires of a poly-phase line. In the embodiment illustrated in FIG. 11b, the power line is a three-phase power line consisting of conductive wires 370, 374 and 376, each representing one phase. Sensor units 310, 304 and 306 are each attached to hot conductive wires 370, 374 and 376, respectively.

FIG. 11b schematically illustrates an embodiment of a sensor system 300 for a medium-voltage, overhead power distribution system. Sensor unit 310 may have any suitable configuration to simply and accurately measure voltage-related properties of a medium-voltage power line. In the embodiment illustrated, measurement circuitry 354 includes one or more sensors for measuring these properties. For example, measurement circuitry 354 may include a voltage sensor 354b configured to sense and measure a voltage from hot wire 370.

Voltage sensor 354b may be configured in any suitable way to measure a voltage from hot wire 370. For example, voltage sensor 354b may be connected to a capacitive voltage divider to measure a portion of the voltage on hot wire 370. A capacitive voltage divider may be created in any suitable way to divide the voltage from the hot wire 370. In the embodiment illustrated, a capacitive voltage divider is created using a first, small capacitor 362 connected at electrode 362a to hot wire 370 and connected to a second, larger capacitor 364 at the other electrode 362b. The second capacitor is connected at electrode 364b to neutral wire 372 and connected at electrode 364a to electrode 362b of capacitor 362 via port 314. However, it should be appreciated that the second capacitor may be connected to any wire acting as a reference against which the voltage on hot wire 370 is measured.

In some embodiments, the second capacitor 364 may be larger than the first capacitor 362. The ratio of capacitances, for example, may be 10:1 or more. In other embodiments, the ratio may be on the order of 20:1, 30:1, 40:1, 50:1, 60:1, 70:1 or higher. However, it should be appreciated that the relative sizes of the capacitors may be modified depending on the desired output voltage. For example, for a medium-voltage power distribution system, this output voltage may be on the order of 600V. Capacitors 362 and 364 may be off the-shelf components, and capacitor 364 may be designed for use with medium voltage lines.

In one embodiment, the sensor unit 310 uses resistors instead of capacitors 262, 264 and is configured for use with Medium Voltage (MV) distribution lines that operate at higher voltages. By way of example, these MV distribution lines operate in the range of 33 kV up to 50 kV. In one aspect, the sensor unit 310 is configured for use on MV distribution lines by increasing the length (L) of the large bottom resistor 364 in the resistive divider that the sensor uses to measure line voltage. In another aspect, the resistance value (R) of the bottom resistor 364 also requires increasing the resistance value to reduce the power consumption and heating of the resistor which may results from operation at the higher voltages. Uncontrolled heating of the resistor may result in reduced reliability and premature aging of the resistive divider components.

Figure 11D:
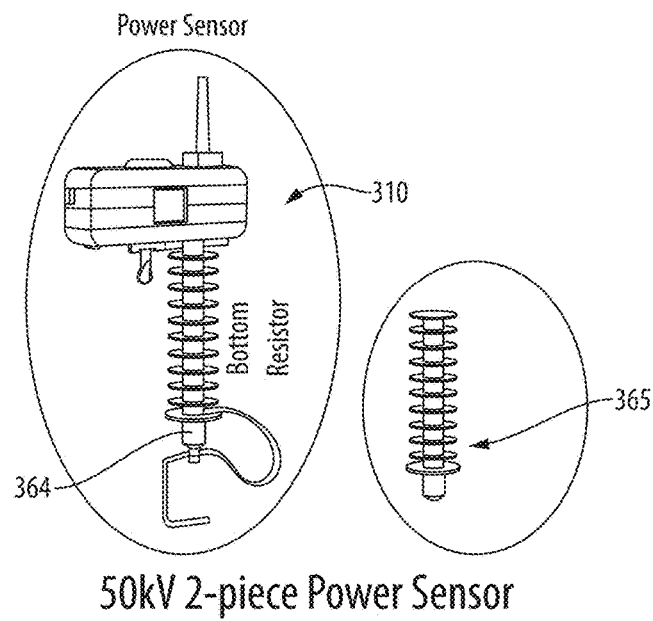
FIGS. 11d and 11e are photographs of a sensor unit in communication with a second stand-alone resistor element, according to one embodiment.
Figure 11E:
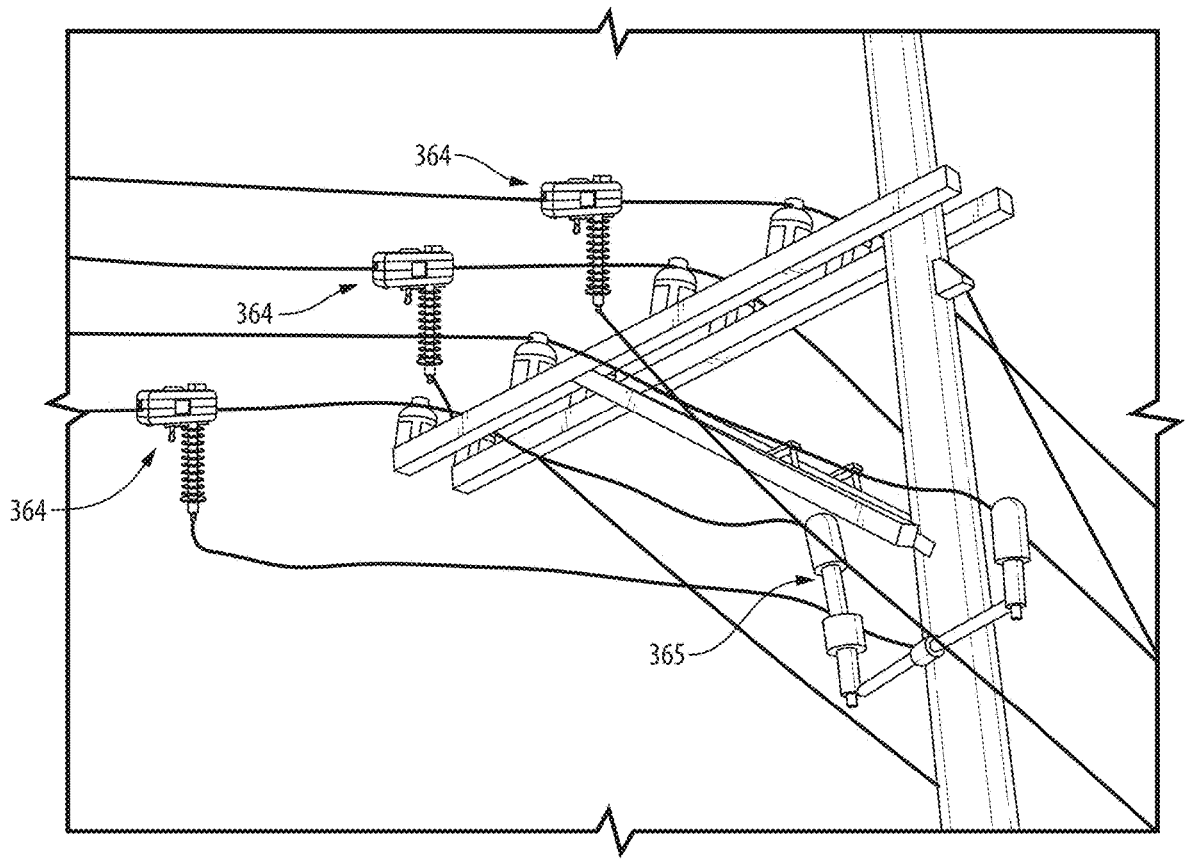

In another embodiment, as shown in FIGS. 11d-11e, one or more sensor unit 310 are configured for use with MV lines by connecting the existing bottom resistor 364 or capacitor in series with a separate 'stand-alone" resistor 365 or capacitor using a conductive wire 378. The stand-alone resistor 365 or capacitor may be mounted to the utility pole and further connected in electrical communication with ground, a neutral wire 372 or another hotwire of the distribution network. This configuration may be used with for new deployments of the sensor unit 310, as well as retrofitting existing sensor unit deployments. When the bottom resistor 364 or capacitor is in communication with the stand-alone resistor 365 or capacitor, effectively a single-piece 50 kV sensor resistor or capacitor is provided for MV line distributions.

In order to sense this voltage, voltage sensor 354b measures a voltage across the first capacitor with a first connection to hot wire 370 at electrode 362a and a second connection to electrode 362b at tap 366 between the two capacitors, as illustrated in FIG. 11b. This voltage signal can be used to measure voltage, and those measured voltages may be processed to reveal signal harmonics, one or more frequencies, disturbances, faults, and/or a relative phase angle between the voltage signal and other sensed signals, such as current signals.

Measurement circuitry 354 may also contain circuitry to measure current on hot wire 370. For example, current sensor 354c may be implemented using any suitable current sensor to sense a current signal on the wire. Possible current sensors may include, but are not limited to, a Hall-effect sensor, Rogowski coil or a current transformer. Current sensor 354c may also output information that indicates a direction and phase of a current signal from hot wire 370.

Measurement circuitry 354 may include any number of other sensors, such as environmental sensors (not shown). Examples include, but are not limited to, electric field sensors, GPS, accelerometers and/or temperature sensors.

Measurement circuitry 354 may also include circuitry for processing measured signals. Conventional processors (not shown) may be programmed to determine any number of power-related properties of hot wire 370 using sensed current and voltage signals. Examples of processed power-related properties include, but are not limited to: power, direction of power, direction of fault, detection of theft, power quality, and/or power factor.

Signals from multiple sensors may be processed to determine a power-related property representing the section of the power line the sensor is associated with. For example, signals measured from sensor units 310, 304 and 302 may be combined during the analysis of the power-related properties. The sensor units may communicate in any suitable way to enable the measurements from multiple sensor units to be processed together. Sensor units, for example, may communicate with each other such that one or more of the sensor units receives measurements made at one or more other sensor units. Alternatively or additionally, one or more sensor units may communicate with a central station, and processing may be performed at the central station. Sensed and/or processed signal data may be transmitted in any suitable way. In FIG. 11b, data is transmitted via transmitter 332 and may be collected by a controller 150 (FIG. 9) or other suitable component.

Measurement circuitry 354 may be configured to be powered in any suitable way. In the embodiment illustrated, the measurement circuitry may be powered via power harvesting unit 354a. Power harvesting unit 354a may include any suitable mechanism to draw energy from the power line to which the sensor unit is attached. In some embodiments, it may draw power from across capacitor 362. However, in other embodiments, it may include a coil inductively coupled to the power line. The harvested energy may supply power unit 352.

Power unit 352 may include any suitable energy storage device, for example, a battery or a super-capacitor, and power electronics known in the art to facilitate the charge transfer. Power unit 352 may be charged in any suitable way. For example, power unit 352 may be connected across the first capacitor 362 with one connection at the hot wire 370 and a second connection at the measurement tap 366 of the capacitive voltage divider. In this way, power unit 352 may still be powered even if there is no current flow on the line, for example, in case of a fault.

Power unit 352 is not restricted to powering the measurement circuitry and may also provide power to one or more devices external to the sensor unit. External device 380 may be a device that requires constant power, such as a radio. In the embodiment illustrated, external device 380 is physically connected to sensor unit 310 via port 316 and has a first connection to a first polarity of power unit 352 and a second connection to a second polarity of the power unit 352. In some embodiments, the external device 380 may be another sensor unit without power harvesting capability or may have power harvesting capability, but may use power from power unit 352 for redundancy and fault tolerance.

Figure 12:
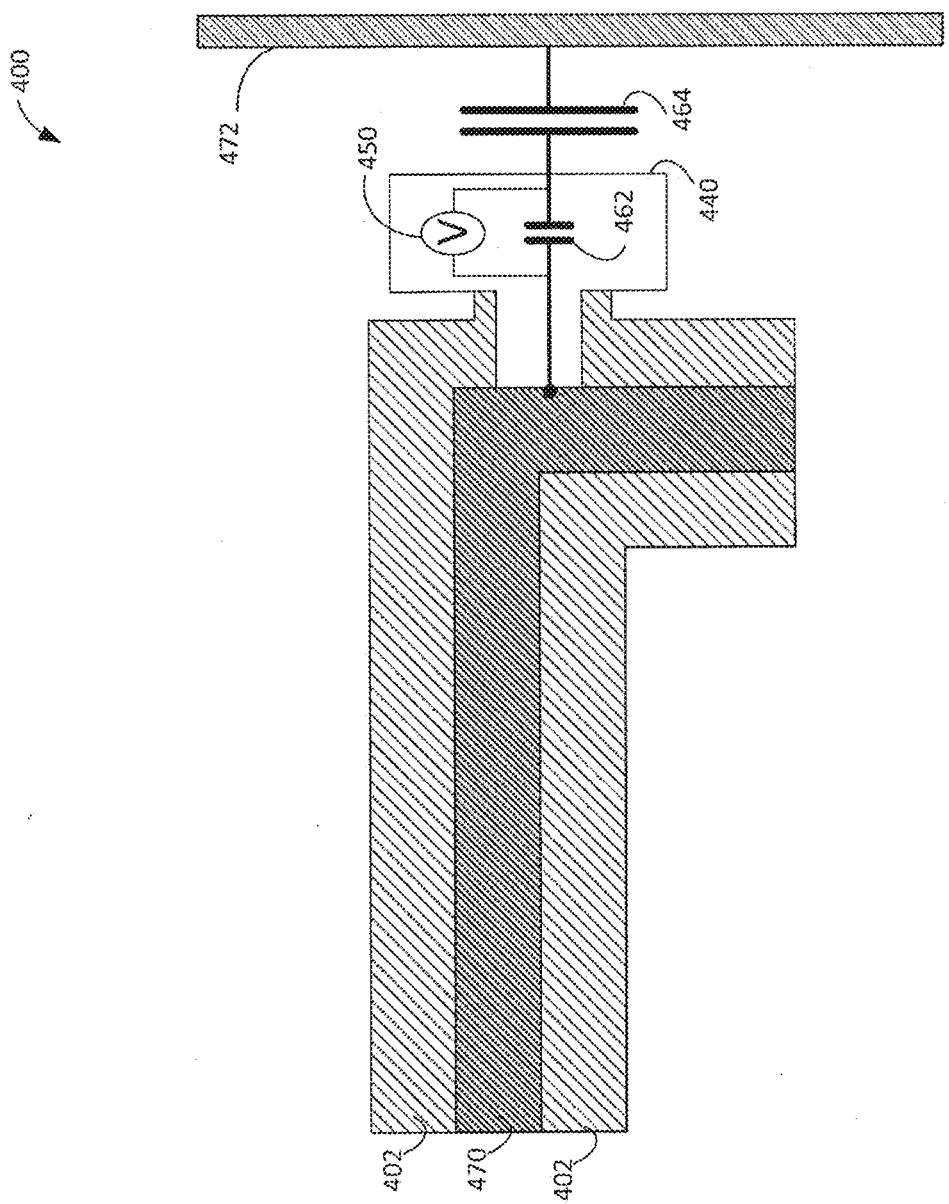
FIG. 12 is a schematic illustration of a sensor configuration in accordance with some embodiments of a system for sensing and measuring at least one voltage-related property of an underground power line.

As noted above, FIG. 11c illustrates an attachment mechanism by which a sensor unit may be attached to an above ground wire. A sensor unit, however, may be coupled to any suitable type of power line. FIG. 12 illustrates an embodiment of an underground sensor system 400. In the embodiment illustrated, sensor unit 440 is attached to an underground power line 470. In this example, the portion of the underground power line illustrated includes an elbow, which may be implemented using components as are known in the art. In this example, the elbow includes a test access port. Sensor unit 440 is configured for easy incorporation into an underground power distribution system. In this example, sensor unit 440 is sized to fit at least partially within a test access port on the medium voltage underground line. Sensor unit 440 measures voltage on conductor 114.

Here, sensor unit 440 is inserted in an opening in an insulative covering 402 on the power line. In this example, that opening may be a test access port. As shown, sensor unit 440 at least partially fits within the test access port. The portion within the test access port may include a connection to an electrode of a first, small capacitor 462. Other components of the sensor unit, such as the first capacitor, voltage sensor, and processing circuitry, such as those shown in FIG. 10, FIG. 11b and FIG. 13 may be located outside of the test access port. Other components of the sensor system 400 may include a second, larger capacitor 464 connected to the small capacitor and located outside the sensor unit. The second capacitor 464 may be connected to a neutral power line 472. The small and large capacitors may have a ratio as described above, or any other suitable ratio. The capabilities and components of the sensor system for underground use may be as described above for an above-ground power line.

The components of sensor system 400 may be arranged in any suitable way to create a simple underground sensor configuration. It should be appreciated that the illustration in FIG. 12 is a simplified representation of an underground sensor unit and system. Other components may alternatively or additionally be included to facilitate an underground power line measurement.

Figure 13:
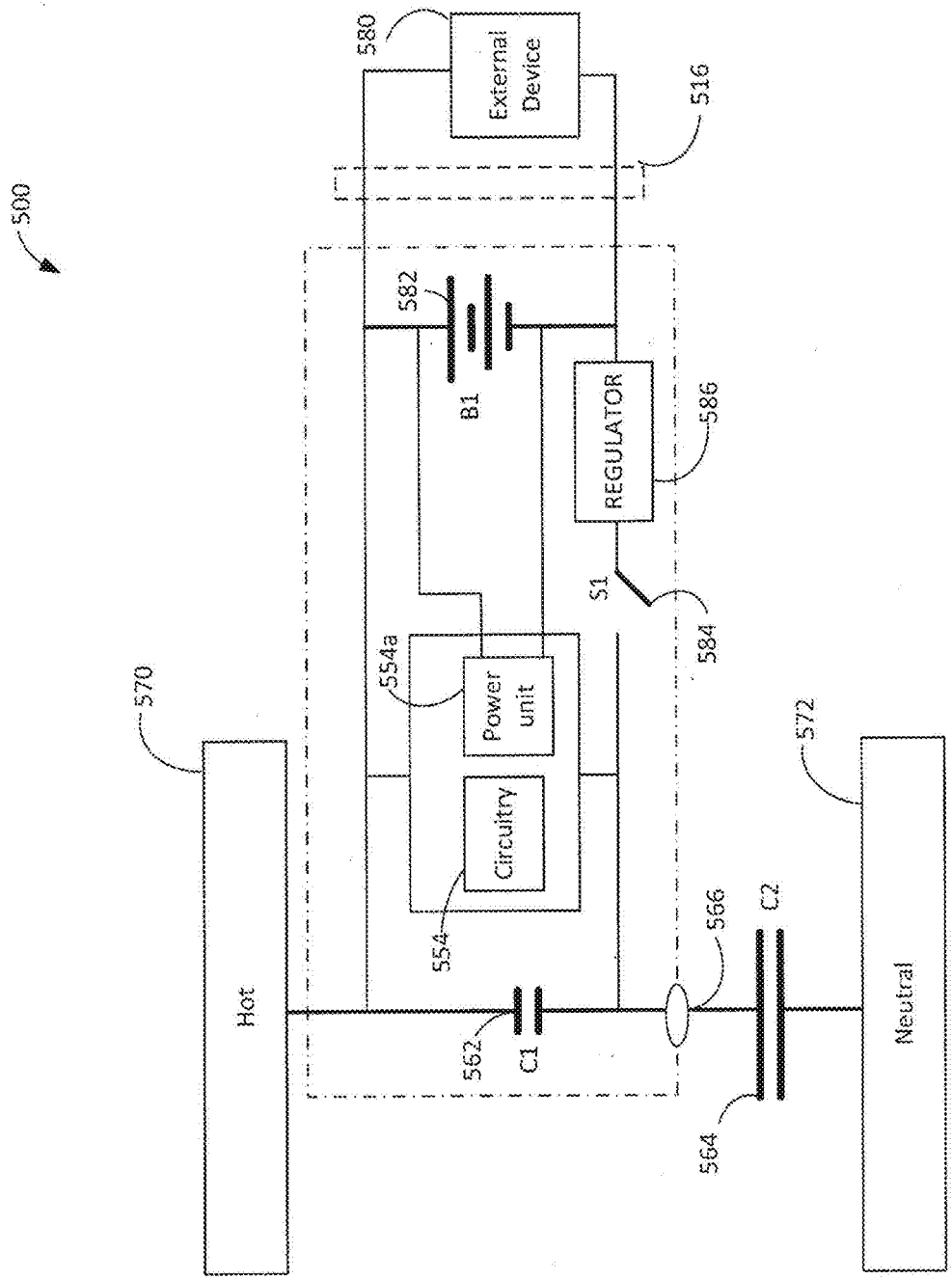
FIG. 13 is a schematic illustration of a sensor configuration in accordance with some embodiments of a system for sensing and measuring at least one voltage-related property of a power line.

FIG. 13 schematically illustrates a power source configuration for sensor system 300. As described above, the electronic components of sensor system 300 may be configured to derive power from the power line. In this example, power is capacitively coupled from the hot conductor 570 using circuit 500. In the embodiment illustrated, a portion of the power from hot conductor 570 may be accessed across a first capacitor 562 such that power may be drawn from conductor 570 even if no current is flowing on the conductor.

Power coupled from first capacitor 562 may charge a storage device 582. As an example, the storage device may be a battery or a super capacitor. Here, that power may be coupled through regulator 586 to provide an appropriate voltage or power of other characteristics. That power may then be coupled to circuitry 554 and other active components. Circuitry 554 may include a voltage sensor and/or a current sensor. Alternatively or additionally, circuitry 554 may include a processor, which may be programmed to execute control and/or signal processing algorithms. Circuitry 510 also may include a transceiver and/or other suitable communication circuitry. Additionally, the power source may also be configured to provide power to one or more external devices attached to sensor unit 310. In the embodiment illustrated, external device 580 is connected to storage device 582 via port 516.

Powering measurement circuitry and/or storing charging a charge storage device from the power line may impact the voltage on the power line. In some embodiments, the impact of the voltage on the power line from harvesting power may be undesirable. Accordingly, the charging circuitry may be isolated from the power line while a measurement of the voltage or other property of that line is being made. During the measurement, the measurement circuitry may be powered from the charge storage device.

Any suitable isolation techniques may be applied to circuit 500 to manage the power drawn from first capacitor 562 to ensure accurate voltage measurements. In this example, an isolation switch 584 may be used to isolate capacitor 562 from storage device 582 while voltage measurements are taken. Isolation switch 584 may be arranged in circuit 500 such that when closed, storage device 582 is connected to first capacitor 562 via tap 566. When the switch is opened, storage device 582 is disconnected from first capacitor 562 at tap 566 but remains connected to deliver power to circuitry power unit 554a and/or external device 580. Isolation switch 584 may be controlled in any suitable way. For example, isolation switch 584 may be controlled by a processor or other suitable control circuitry.

In other embodiments, circuit 500 may use other techniques to ensure accurate voltage measurements are taken without an isolation switch. For example, tap 566 may not be isolated from the storage device 582 which may draw power during a voltage measurement. Rather, computational techniques may be used to ensure accurate measurements when the measurement point and storage device are not isolated.

Figure 14:
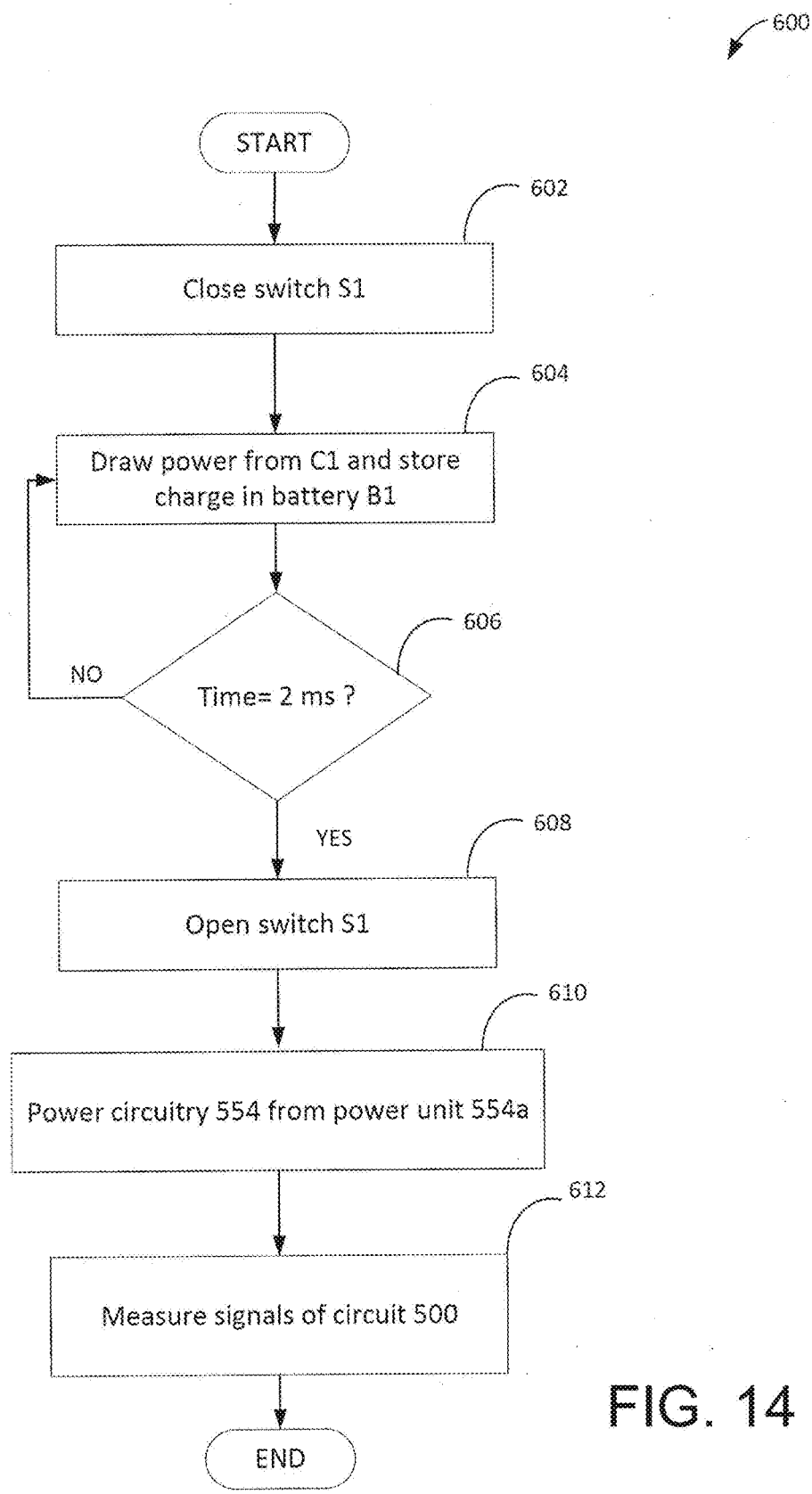
FIG. 14 is a flowchart of an illustrative process in accordance with some embodiments for managing power harvesting from a power line while measuring at least one power-related property of a power line.
Figure 15:
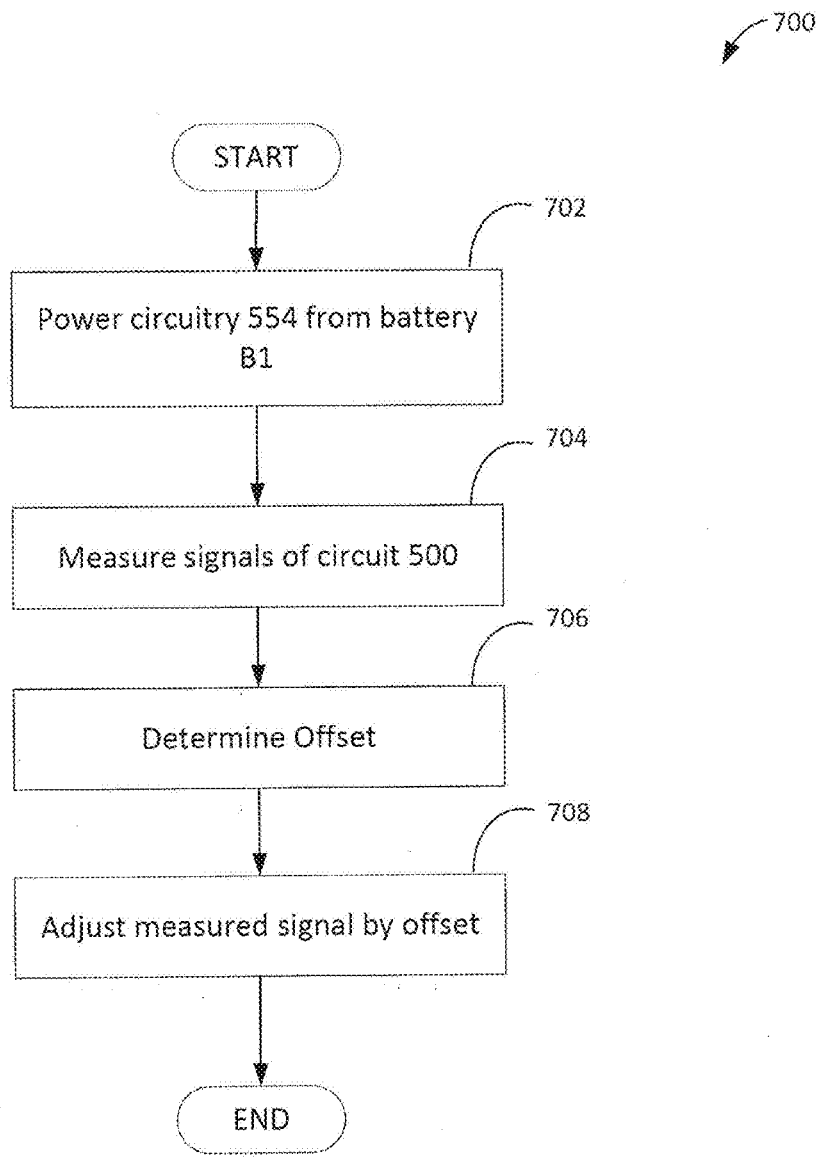
FIG. 15 is a flowchart of an illustrative process in accordance with some embodiments for compensating for the impact of power harvesting from a power line while measuring at least one power-related property of the power line.

FIGS. 14 and 15 show flowcharts of illustrative processes 600 and 700, respectively, for maintaining accurate voltage measurements while drawing power from a power line. Processes 600 and 700 may be executed by any sensor unit and, for example, may be performed by sensor unit 310 described with reference to FIG. 11a-3b. In particular, in some embodiments, some or all of the acts of processes 600 and 700 may be performed by control circuitry 230 described with reference to FIG. 10.

Process 600 begins in act 602, where a sensor unit executing the process may close a switch S1 in any suitable way using components known in the art. For example, sensor unit 310 may close isolation switch 584 in circuit 500 using regulator 586. Closing switch 584 connects storage device 582 to the first capacitor 562 at tap 566.

Next, process 600 proceeds to act 604, where power may flow into a storage device 582 in any suitable way. For example, power may flow from first capacitor 562 to storage device 582 in circuit 500.

Power draw from the first capacitor 562 may be controlled in any suitable way to ensure accurate voltage measurements. For example, power may be drawn for a limited period of time to ensure that the voltage on capacitor 562 does not change appreciably during a measurement. In act 606, control circuitry limits the power draw to 2 ms. It should be appreciated that 2 ms is an example only, and any suitable duration of power flow may be used. For example, the power draw periods may be seconds or minutes, interrupted by short intervals during which measurements are made. During the power draw periods, signal measurements may be halted. For example, no voltage measurements are taken at tap 566 during the 2 ms power draw period. After the power draw period expires, power draw ceases and measurements may start again.

Next, process 600 proceeds to act 608, where switch Si may be opened in any suitable way. For example, as described above for closing switch 584, switch 584 may be opened using similar circuitry and methods. Opening switch 584 isolates storage device 582 from the first capacitor 562 at tap 566.

Next, process 600 proceeds to act 610, where circuitry 554 may be powered in any suitable way. For example, power unit 554a is still connected to storage device 582 when switch 584 is open and may provide power to circuitry 554.

Next, process 600 proceeds to act 612, where circuitry 554 may accurately measure signals of circuit 500 in any suitable way. For example, voltage sensor 354b may measure the voltage at tap 566 to determine a voltage level on hot conductor 570 while storage device 582 is in an isolated state. The voltage measurement may thus avoid measuring disturbances caused by power draw from storage device 582. Using the process 600, in which the charge storage device is recharged when a measurement is not being made on the line from which power is being harvested, circuit 500 may thus accurately measure voltage signals while powering the measurement circuitry from the power coupled from the power line. Other measurements may similarly be made in these measurement intervals. For example, current sensor 354c may measure a current signal from hot conductor 570. It should be appreciated that other sensor measurements not affected by the disturbances caused by storage device 582 drawing power may be made regardless of the isolated state of the storage device.

Alternatively, computational compensation techniques may be used to reduce the impact of inaccurate measurements by measuring a parameter of a line while power is being harvested from that line. For example, process 700 may not involve isolating the measurement components from the energy storage components. Instead, process 700 may involve measuring signals and drawing power from the same measurement points simultaneously, with computational steps to determine and correct for distortion caused by power harvesting.

Process 700 begins in act 702, where a sensor unit executing the process may draw power into storage device 582 in any suitable way. For example, sensor unit 310 may capacitively couple power from hot conductor 570 to storage device 582 in circuit 500 as illustrated in FIG. 13.

Next, process 700 proceeds to act 704, where signals are measured while power draw takes place. For example, a raw voltage signal is measured at tap 566. The raw voltage signal may contain disturbances from the power being drawn to storage device 582.

Next, process 700 proceeds to act 706, where processing circuitry assesses the impact of the disturbances on the voltage measurement. For example, measurement circuitry 554a may include processing circuitry, which calibrates the voltage measurement to determine deviations from an expected measurement. Such calibration, for example, may entail measuring a voltage on a power line with and without drawing power from the line to power the measurement circuitry. Any difference in the measured values may indicate the impact of drawing power from the measured line. This value may be different for different lines or different measurements. For example, measurement circuitry may have a greater impact on a medium voltage line than on a higher voltage line. Accordingly, calibration may entail determining multiple values representing the impact of the power drawn under multiple scenarios. Processing at block 706 may entail selecting the appropriate value from a pre-stored table.

Calibration may be performed prior to deployment of the sensor unit, or upon installation of the sensor unit, or at other times while the sensor unit is deployed. While FIG. 15 illustrates that an offset is computed as part of correcting a measurement, it should be appreciated that the calibration process making available values for computing the offset may be performed at other times. The results of that calibration may be reflected by one or more calibration values stored in memory. In such an embodiment, processing at block 706 may entail selecting and/or reading the appropriate value from that calibration memory.

In other embodiments, the offset may be determined in other ways. For example, the impact of drawing power from the line being measured may be calculated. The amount of current drawn by measurement circuitry, for example, may be known. The impact on the voltage of a line based on that amount of current shunted from the line may be calculated based on a model of the properties of the line. However, it should be appreciated that the offset may be determined in any suitable way.

Regardless of how the offset is determined, process 700 may proceed to act 708, where the offset may be applied to the raw voltage measurement. For example, the offset may be subtracted from or filtered out of the raw voltage measurement to eliminate the disturbances in the voltage signal. The voltage measurement may then be used in any suitable way, including in combination with current measurement to ascertain power-related parameters on the line.

Having thus described several aspects of at least one embodiment of this invention, it is to be appreciated that various alterations, modifications, and improvements will readily occur to those skilled in the art.

For example, embodiments are described in connection with a power distribution system used to deliver power from generation facilities to consumers of that power. However, the techniques described herein may be applied to transmission and distribution conductors in any other suitable setting. For example, techniques described herein may be used to obtain measurements of electrical properties of power lines used by the railway and streetcar industries or of high-voltage conductors used in subway systems.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein. Accordingly, the foregoing description and drawings are by way of example only.

The above-described embodiments of the present invention can be implemented in any of numerous ways. For example, embodiments involving computation or computerized control may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Additional output devices may include other operational support systems used by a utility to monitor and control their network. Examples of the uses of output from this system could be control of voltage regulators, control of capacitor banks, power consumption data for billing systems, output into outage management systems, or output into fault location isolation and restoration (FLIR) systems. Interfaces into these other operational support systems may include proprietary data interfaces or industry standard protocols such as DNP-3 or IEC 61850. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, aspects of the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A distributed resistance lead for an electronic properties sensor unit comprising:
   a first end configured for connection to the electronic properties sensor unit;
   a second end configured for connection to a wire of a power line;
   an insulative sheath surrounding a dielectric portion;
   a high resistance extrusion portion disposed in a dielectric portion;

a connector disposed at the first end and configured to connect to the sensor unit via a mating face, the connector including
an insulative sleeve,
an elongated resistive element,
a first conductive portion disposed in the insulative sleeve and in electrical communication with the elongated resistive element,
a second conductive portion disposed in the insulative sleeve and in electrical communication with the elongated resistive element, and
a resistive spacer portion disposed between the first and second conductive portions.

2. The distributed resistance lead of claim 1, further including a center hole in the high resistance extrusion portion.

3. The distributed resistance lead of claim 2, wherein the center hole is configured to accommodate a centering pin.

4. The distributed resistance lead of claim 1, wherein a layer of fiberglass is disposed on the dielectric portion.

5. The distributed resistance lead of claim 1, wherein the second end includes a clamp, the clamp being configured to connect to a neutral or ground wire of the power line.

6. The distributed resistance lead of claim 1, wherein the electronic properties sensor unit is disposed on a hot wire of the power line.

7. The distributed resistance lead of claim 1, wherein the elongated resistive element comprises a plastic/carbon fiber extrusion.

8. The distributed resistance lead of claim 1, wherein the distributed resistance lead further comprises a rigid housing, and wherein the insulative sheath is disposed in the rigid housing.

9. The distributed resistance lead of claim 8, wherein the rigid housing includes a threading.

10. A lead for an electronic properties sensor unit comprising:
a first end configured for connection to the electronic properties sensor unit;
a second end configured for connection to a wire of a power line;
an insulative sheath;
a first substrate disposed in the insulative sheath, the first substrate including,
a first input,
a first output,
a first conductive trace in electrical communication with the first input, and
a first resistive element in electrical communication with the first conductive trace;
a first conductive trace in electrical communication with the first input,
a first resistive element in electrical communication with the first conductive trace; and,
a connector disposed at the first end and configured to connect to the electronic properties sensor unit via a mating face, the connector including
an insulative sleeve,
an elongated resistive element,
a first conductive portion disposed in the insulative sleeve and in electrical communication with the elongated resistive element,
a second conductive portion disposed in the insulative sleeve and in electrical communication with the elongated resistive element, and
a resistive spacer portion disposed between the first and second conductive portions.

11. The lead of claim 10, wherein the second end includes a clamp, the clamp being configured to connect to a neutral or ground wire of the power line.

12. The lead of claim 10, wherein the electronic properties sensor unit is disposed on a hot wire of the power line.

13. The lead of claim 10, wherein the elongated resistive element comprises a plastic/carbon fiber extrusion.

14. The lead of claim 10, further comprising a second substrate including
a second input,
a second output,
a second conductive trace in electrical communication with the second input, and
a second resistive element in electrical communication with the second conductive trace.

15. The lead of claim 14, wherein a conductive jumper connects the first output of the first substrate to the second input of the second substrate.

16. The lead of claim 15, wherein the conductive jumper is flexible.

17. The lead of claim 16, wherein the conductive jumper and second substrate are disposed in the insulative sheath.

18. The lead of claim 10, wherein the first substrate is a flexible substrate.

19. A connector for a distributed resistance sensor lead comprising:
an insulative sleeve;
a mating face including a shielding portion;
an elongated resistive element;
a first conductive portion disposed in the insulative sleeve and in electrical communication with the elongated resistive element via a first contact point, wherein the first conductive portion includes a second projecting portion configured to connect to a first mating contact of an electronic properties sensor unit;
a second conductive portion disposed in the insulative sleeve and in electrical communication with the elongated resistive element via a second contact point, wherein the second conductive portion includes a second projecting portion configured to connect to a second mating contact of the electronic properties sensor unit;
a resistive spacer portion disposed between the first and second conductive portions on the elongated resistive element,
wherein the first and second projecting portions extend from an inside of the insulative sleeve to an outside of the insulative sleeve, and into the shielding portion of the mating face.

20. The connector of claim 19, wherein the elongated resistive element comprises a plastic/carbon fiber extrusion.

* * * * *